Figure 2:
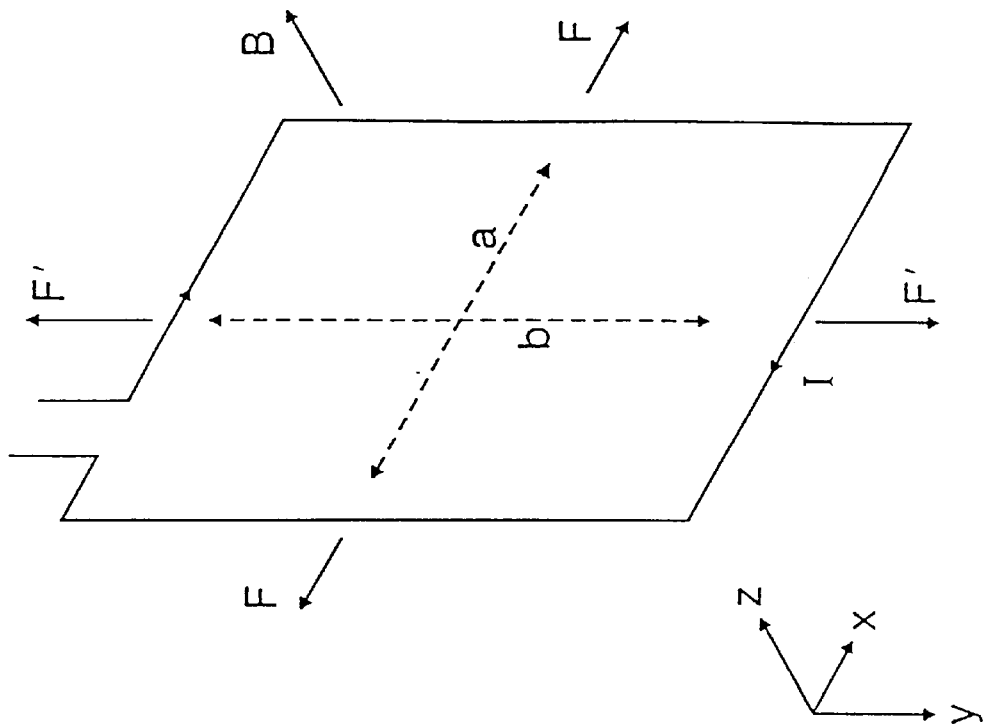

United States Patent [19]
Mansfield

[11] Patent Number: 5,990,680
[45] Date of Patent: Nov. 23, 1999

[54] ACTIVE ACOUSTIC CONTROL IN QUIET GRADIENT COIL DESIGN FOR MRI

[76] Inventor: Peter Mansfield, 68 Beeston Fields Drive, Bramcote, Nottingham NG9 3DD, United Kingdom

[21] Appl. No.: 08/765,119
[22] PCT Filed: Mar. 28, 1996
[86] PCT No.: PCT/GB96/00734
  § 371 Date: May 13, 1997
  § 102(e) Date: May 13, 1997
[87] PCT Pub. No.: WO96/31785
  PCT Pub. Date: Oct. 10, 1996

[30] Foreign Application Priority Data
  Apr. 1, 1995 [GB] United Kingdom .................. 9506829
[51] Int. Cl.$^6$ .................................................. G01V 3/00
[52] U.S. Cl. ........................................... 324/318; 600/422
[58] Field of Search ...................... 324/300, 318, 324/307; 600/410, 422

[56] References Cited

U.S. PATENT DOCUMENTS

| 5,427,102 | 6/1995 | Shimode et al. | 324/318 |
| 5,572,131 | 11/1996 | Rzedzian | 314/318 |

FOREIGN PATENT DOCUMENTS

| PCT/US91/ 03996 | 12/1991 | WIPO . |
| PCT/GB94/ 01187 | 12/1994 | WIPO . |
| PCT/GB96/ 00734 | 10/1996 | WIPO . |

OTHER PUBLICATIONS

"Quiet Gradient Coils . . . " Chapman et al. Meas. Sci. Technol. 6(1995) pp. 349–354 pub. Jan. 1995.

"Quiet Transverse Gradient Coils: Lorentz Force Balanced Designs . . . " Bowtell et al. MRM 34: 494–497 May 1995.

"Active Acoustic Srceening: Reduction of Noise in Gradient Coils by Lorentz Force Balancing" Mansfield et al. MRM 33:276–281 Jan. 1995.

"Active Acoustic Sreening" Mansfield et al. Mansfield et al. Magnetic Resonance Center May 1994.

*Primary Examiner*—Louis Arana
*Attorney, Agent, or Firm*—Jones & Askew, LLP

[57] ABSTRACT

Acoustically controlled magnetic coils comprise first and second electrical conductors which are mechanically coupled by a block of material of defined acoustic transmission characteristics which holds the conductors a predetermined distance apart. The conductors are supplied with currents of different and variable amplitudes and different and variable relative phases both of the features being determined by the acoustic characteristics and by the geometry and predetermined distance.

19 Claims, 22 Drawing Sheets

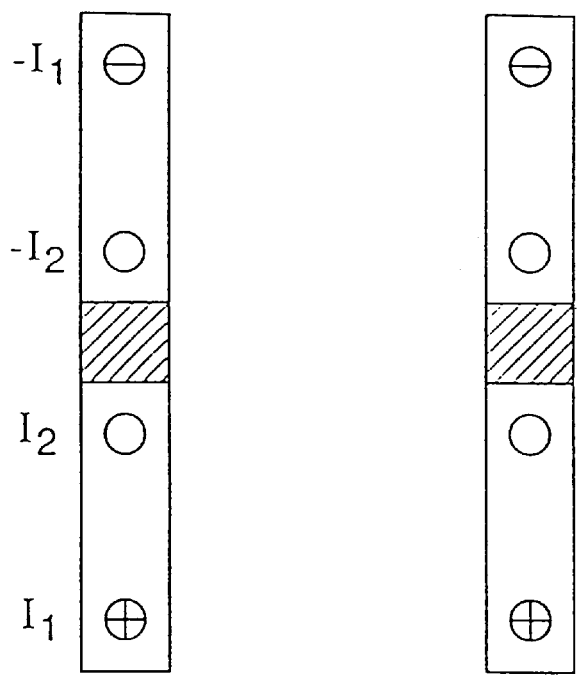
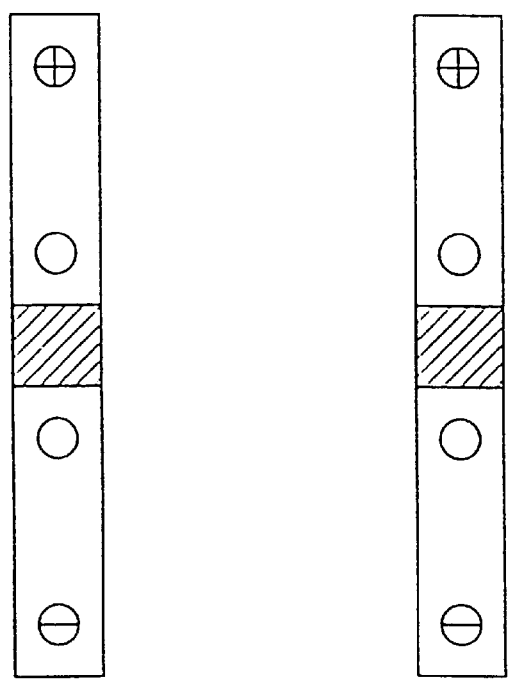
FIG 9

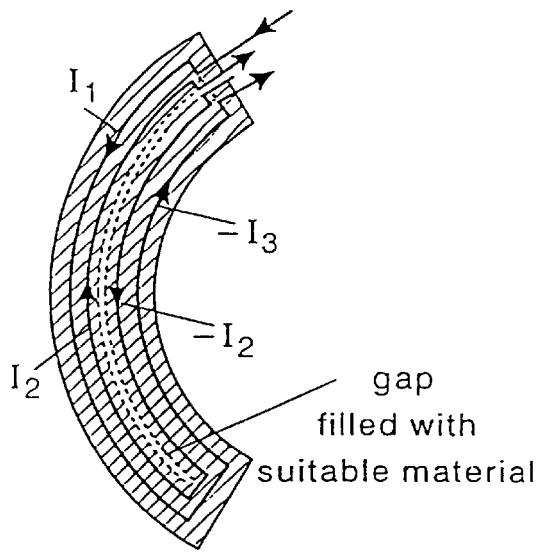
FIG 11(a)
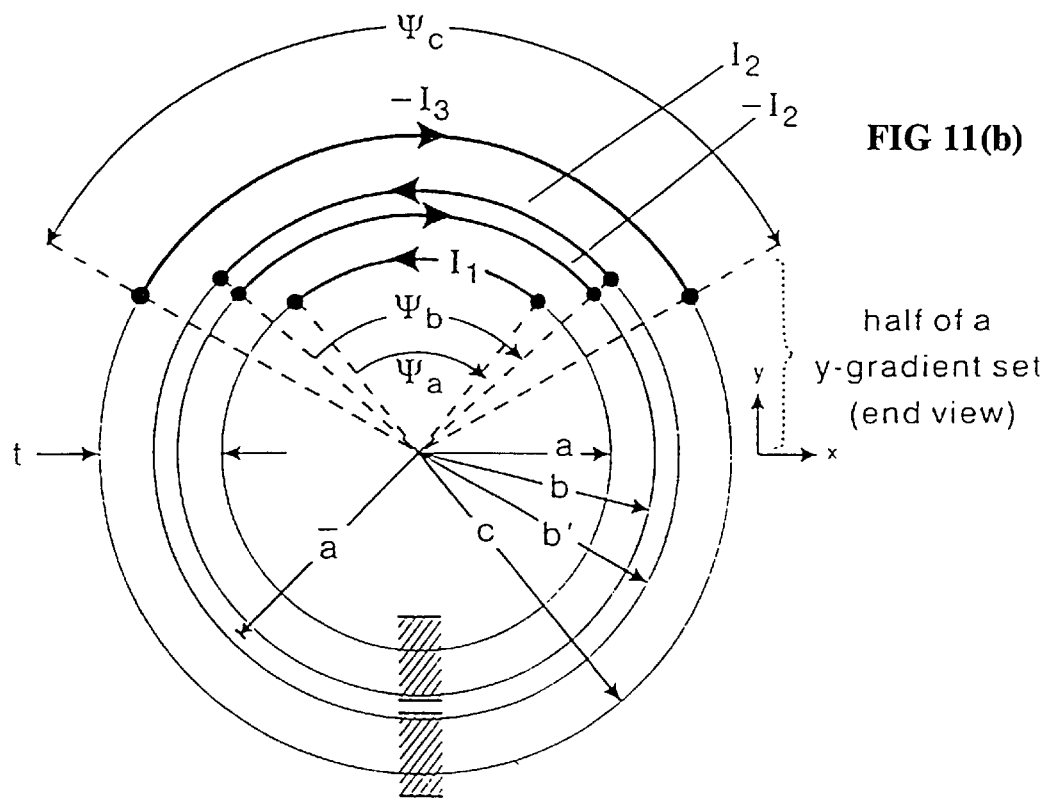
FIG 11(b)
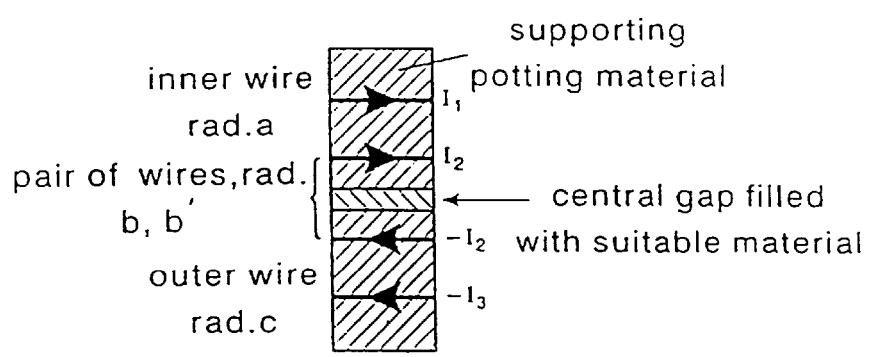

ACTIVE ACOUSTIC CONTROL IN QUIET GRADIENT COIL DESIGN FOR MRI

The present invention relates to acoustically quiet gradient coil design in magnetic resonance imaging (MRI).

Magnetic gradient coils are a prerequisite for NMR imaging (P. Mansfield P. and P. G. Morris, NMR Imaging in Biomedicine. Academic Press, N.Y. (1982)) and also for use in a range of NMR applications including diffusion studies and flow. In NMR imaging the acoustic noise associated with rapid gradient switching combined with higher static magnetic field strengths is at best an irritant and at worst could be damaging to the patient. Some degree of protection can be given to adults and children by using ear defenders. However, for foetal scanning and in veterinary applications, acoustic protection is difficult if not impossible.

Several attempts have been made to ameliorate the acoustic noise problem. For example, by lightly mounting coils on rubber cushions, by increasing the mass of the total gradient assembly and by absorptive techniques in which acoustic absorbing foam is used to deaden the sound. Acoustic noise cancellation techniques have also been proposed which rely on injection of antiphase noise in headphones to produce a localised null zone. These methods are frequency and position dependent and could possibly lead to accidents where, rather than cancel the noise, the noise amplitude is doubled.

The present invention relates to a novel method for active control of acoustic output in quiet magnetic gradient coil design henceforth referred to simply as active acoustic control in magnetic coils and magnetic gradient coils which readdresses the cause of the acoustic noise problem over that achieved in uncontrolled active acoustic shielding (P. Mansfield, B. Chapman, P. Glover and R. Bowtell, International Patent Application, No. PCT/GB94/01187; Priority Data 9311321.5, Jun. 2, (1993); P. Mansfield, P. Glover and R. Bowtell, Active acoustic screening: design principles for quiet gradient coils in MRI. Meas. Sci. Technol. 5, 1021–1025 (1994); P. Mansfield, B. L. W. Chapman, R. Bowtell, P. Glover, R. Coxon and P. R. Harvey, Active acoustic screening: Reduction of noise in gradient coils by Lorentz force balancing. Magn. Reson. Med. 33, 276–281 (1995)) and offers considerable improvement in noise suppression.

The present invention provides an active acoustically controlled magnetic coil system which is adapted to be placed in a static magnetic field, the coil comprising a plurality of first electrical conductors and a plurality of at least second electrical conductors, the first and at least the second conductors being mechanically coupled by means of at least one block of material with a predetermined acoustic transmission characteristic and in which the first and at least the second conductors are spaced at a predetermined distance apart, first electrical current supply means for supplying a first alternating current to said first electrical conductor, at least a second electrical current supply means for supplying at least a second alternating current to said at least second electrical conductor, said first and at least second currents characterised in that they have different and variable amplitudes and different and variable relative phases, both these features being determined by the acoustic characteristics of the material and by its geometry and the predetermined distance.

The first and second current supply means may comprise means for supplying current waveforms with controllable shape said waveforms being shaped to fit the wave propagation properties characteristics of the mechanical coupling material. The currents can be rectangular or trapezoidal waveforms and in these cases the second current waveform will be delayed with r respect to the first. The phrase "alternating" is therefore extended to include rectangular or trapezoidal waveforms and the phrase "variable relative phases" is extended to include a delayed second waveform.

The leading and trailing edges of the second waveform will be delayed in time and accordingly shaped to fit the wave propagation properties characteristic of the mechanical coupling material by matching the waveform to that arriving on the far side of the material block through which the acoustic wave is travelling.

Preferably the amplitude of the second current is calculated to be a defined ratio of the amplitude of the first current, the defined ratio being a function of both the distance by which the first and second conductors are separated and the acoustic transmission characteristics of the coupling material.

In a preferred embodiment the first electrical conductor forms an outer loop and the second electrical conductor forms an inner re-entrant loop.

Preferably the inner re-entrant loop comprises first and second substantially parallel path portions connected by a relatively short joining portion, the first and second portions being embedded in first and second separate material blocks, the blocks being mechanically coupled together.

Preferably the coupling can comprise an air gap with spacers positioned at intervals to separate the first and second blocks.

Alternatively the mechanical coupling uses a suitable coupling material.

Preferably the coupling material is a polymer material or rubber which may be a different and softer material to that used to support the first conductor or outer loop.

The present invention also provides a method of designing an active acoustically controlled magnetic coil system comprising the steps of:

a) defining first and second substantially parallel conductor paths;

b) defining an acoustic transmission material having predetermined characteristics to encase the first and second parallel conductors at a predetermined distance apart;

c) determining a first alternating current at a first amplitude and phase to flow in the first parallel conductor path;

d) determining a second alternating current at a second amplitude and phase different to said first amplitude and phase to flow in the second parallel conductor path, the amplitude and relative phase of the second current being determined by the acoustic characteristics of the material and by its geometry and the predetermined distance.

In the present invention the substantially parallel paths may be arcuate for example when the rectangular loops are deformed into closed arc loops. The term substantially parallel is in this invention defined as including equidistantly spaced arcuate paths.

The present invention also provides a coil structure comprising four substantially parallel conductors in a mechanically coupled system including first and second outer conductors and first and second inner conductors, each first and second outer conductor being mechanically coupled to a respective first and second inner conductor by first and second blocks of material with defined acoustic transmission characteristics and in which the first and second blocks are connected together by a third acoustically transmissive material.

The material of the first and second blocks may be identical to the third acoustically transmissive material or may have different acoustic transmission characteristics.

The third acoustically transmissive material may be air.

The present invention also provides means for supplying the first and second outer conductors with a first alternating current having a first defined amplitude and phase and means for supplying the first and second inner conductors with a second current having a second defined amplitude and phase both of which are different to the first alternating current.

The present invention also provides apparatus for supplying driving currents for active acoustically controlled magnetic coils including first coil current supply means for supplying to the magnetic coil a first current at a first phase and second coil current supply means supplying to the magnetic coil a second if current at a different and variable amplitude to the first current and at a second variable phase different to the first phase.

The apparatus can alternatively provide pulsed driving currents of similar waveform but delayed by a variable delay.

Preferably a phase splitter is provided to control the respective phases of the first and second currents.

Preferably acoustic feedback is provided to monitor the sound emitted from the coil.

Preferably the coil system further comprises active magnetic screening coils

Figure 1:
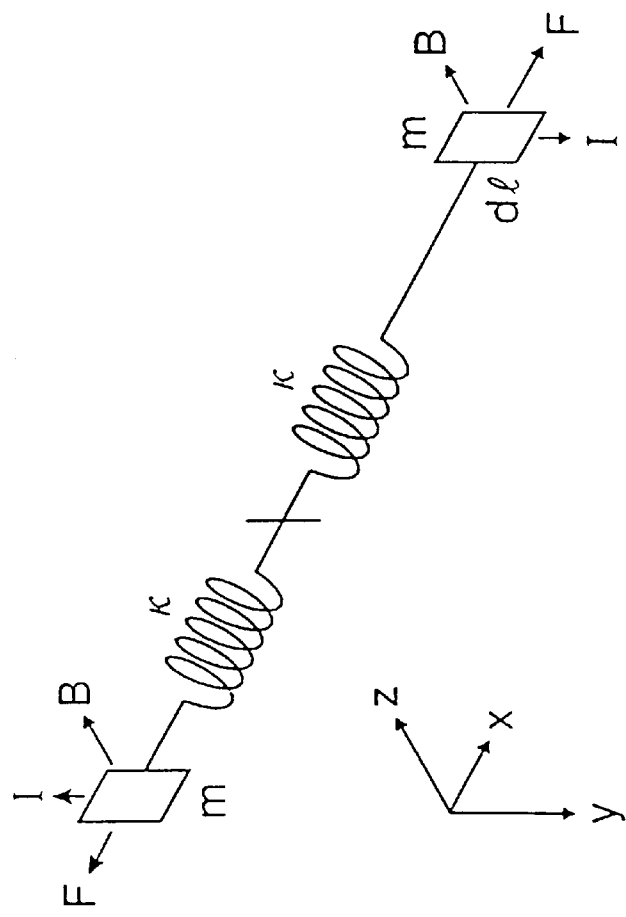

Embodiments of the present invention will now be described, by way of example, with reference to the accompanying drawings in which:

FIG. 1 shows a diagram representing two coupled line elements of conductor, dl, of equal masses m carrying equal and opposite currents. The centre of mass of the system remains fixed if the spring constants, κ, are equal. The system is placed in a magnetic field B which gives rise to the forces F causing displacements.

FIG. 2 shows a rectangular conductor loop carrying a current I placed in magnetic field B such that the loop plane is normal to B. All forces F and F' are balanced,

FIG. 3 shows (a) A diagram with two straight parallel wires lying in the same plane carrying currents $I_1$ and $I_2$. The wires are mechanically coupled with a rigid block of material. The wire plane is arranged to be normal to the magnetic field, B, which is aligned with the z-axis.

Figure 4:
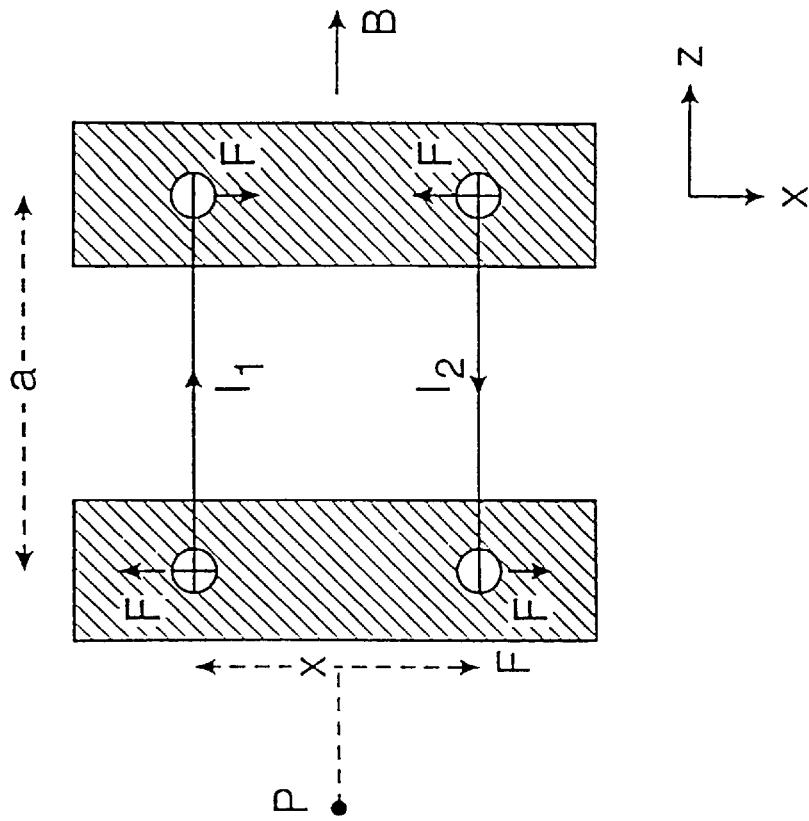
Figure 5A:
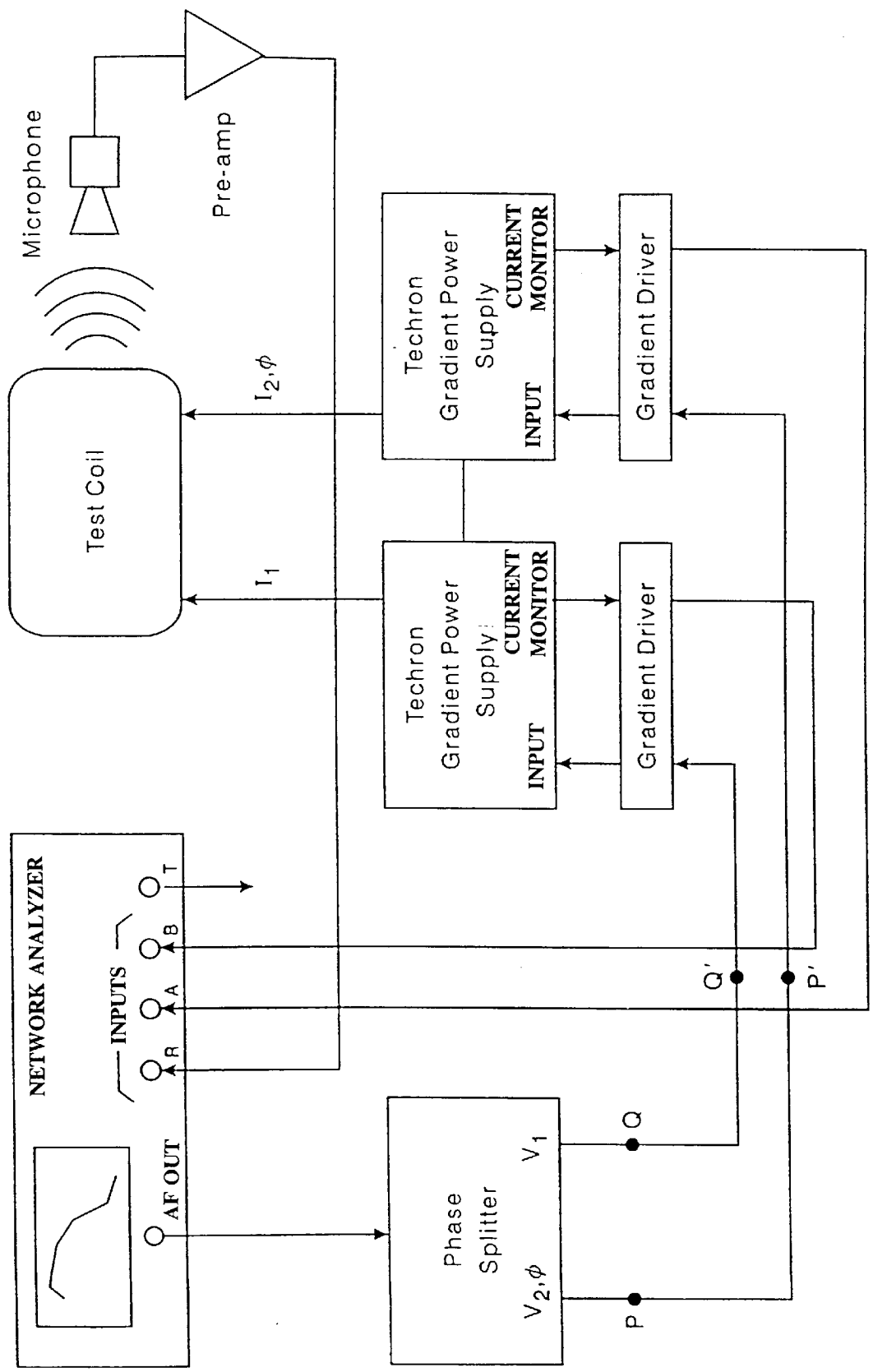

(b) Plan view of the wire pair shown in (a) above. Lorentz forces F and F' squeeze the block, deforming it as indicated by the dotted lines, so that sound, S, is emitted from the surface of the encapsulating solid along the ± z-axis, FIG. 4 shows a plan view of test coil comprising 2 rectangular loops of width a and length b (see also FIG. 2). The coils are spaced a distance x apart. Planes of coils are parallel with B. Shading indicates mechanical coupling between coils created by potting in resin. The currents in each coil $I_1$ and $I_2$ are in general not equal and opposite; Note currents in conductors parallel with B produce no forces. The length of both coils along the y-axis is b (not shown), FIG. 5A shows a sketch of the test coil experimental arrangement which is driven from a Hewlett Packard network analyser via a phase splitter and independent Techron amplifiers providing separate currents $I_1$ and $I_2$ (with relative phase φ) to the two coils. The acoustic output from the test coil is picked up by a microphone and fed back into the network analyser.

Figure 5B:
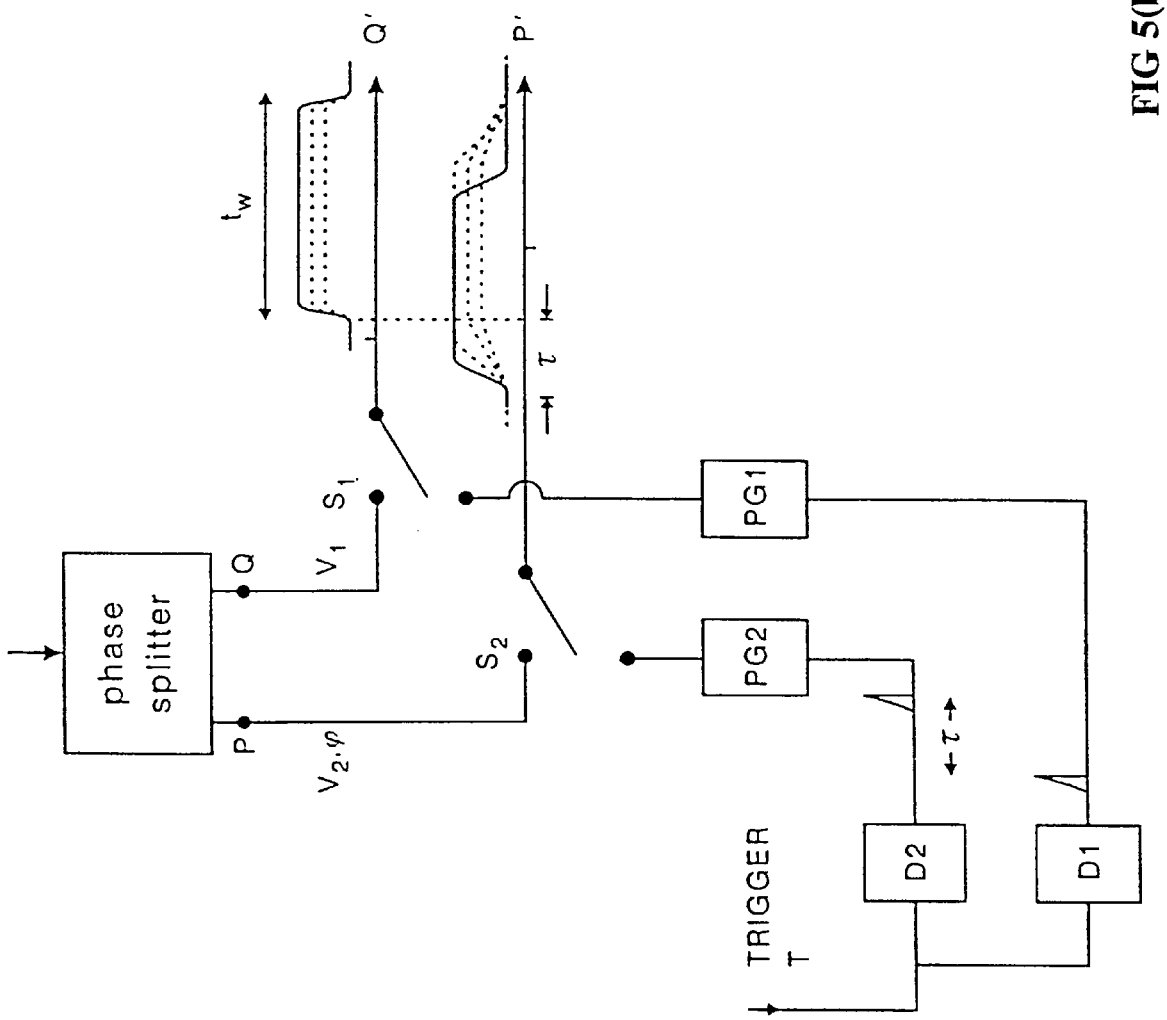

FIG. 5B shows a block diagram of additional electronic equipment required when operated in a pulse gradient mode, The apparatus can alternatively provide pulsed driving currents of variable waveform and delayed by a variable delay.

FIG. 6 shows (a) Graph of sound pressure level output $I_s$ (dB) versus f for the test coil arrangement of FIG. 5. The receiving microphone was placed approximately 1 m from one face of the coil arrangement. The line is the theoretical curve, Eq. [12], for α=θ=0 with 20 $\log_{10} A_1$=80 dB. See text for further details. The squares show experimental data when $I_1=-I_2$. The circles show slightly lower values of $I_s$ when the phase is varied from the 180° condition. The triangular points show even further reductions in $I_s$. $\Delta^1$ corresponds to an increase in current $I_1$ from its initial value of 20 A, while $\Delta^2$ corresponds to a decrease in current $I_2$ from its initial value of 20 A. The $\Delta^2$ points in general show a greater reduction in noise output as one would expect from the theory.

Figure 7:
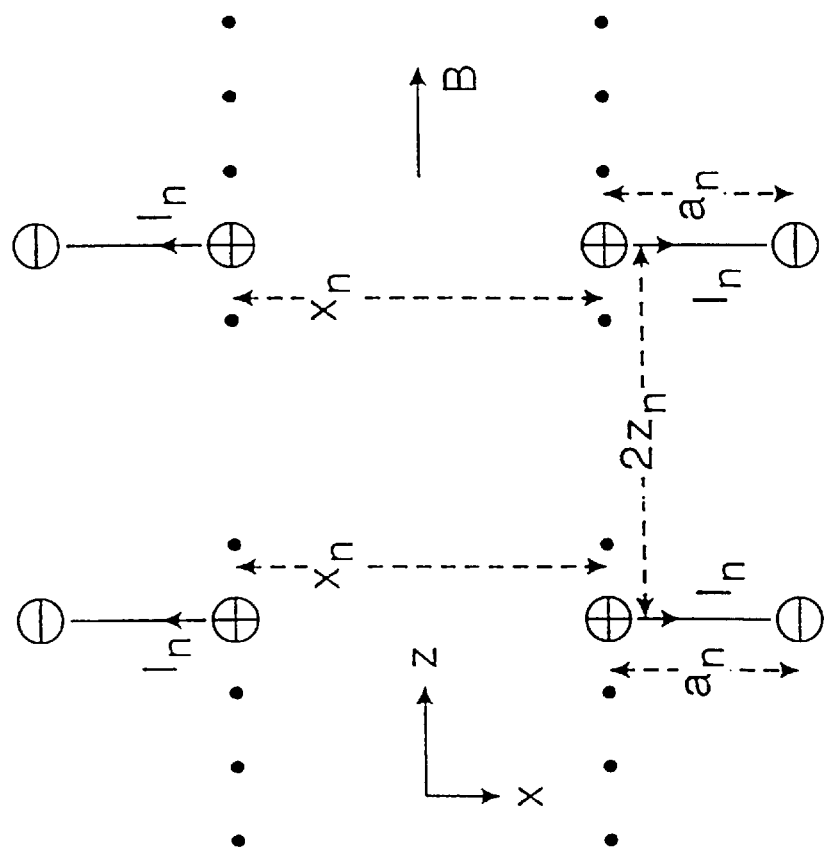
Figure 8:
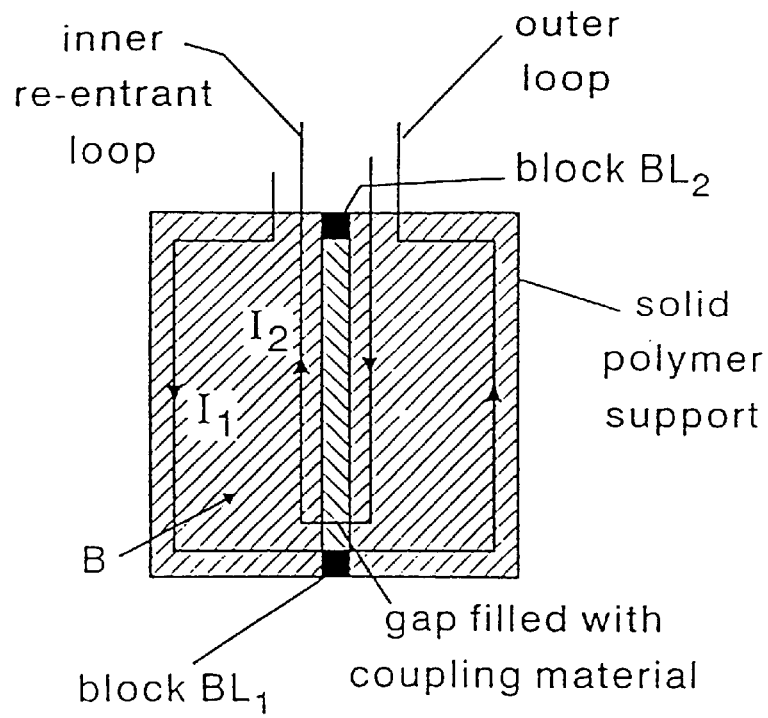
Figure 8:
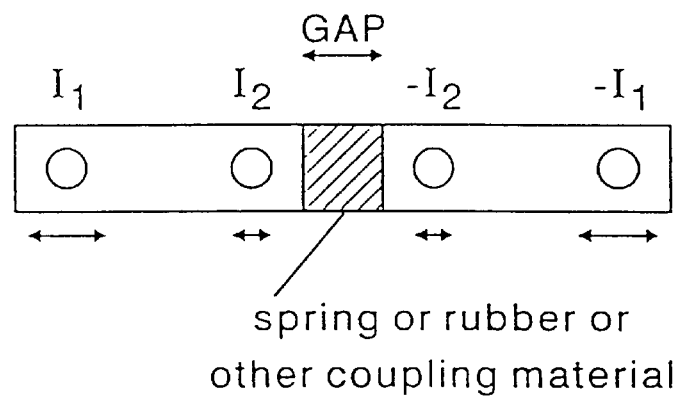

(b) Graph of the phase angle φ versus f for the circled data points. Once this phase had been found it was left unchanged for the subsequent variations in amplitude of $I_1$ and $I_2$. The straight line is the theoretical phase, Eq. [17]. See text for more details, FIG. 7 is a diagram showing the plan view of the nth quartet of rectangular current loops from a set of quartets arranged to produce a magnetic field gradient along the x-axis. Note all currents in the central wires of the nth quartet have the same sense. The length of the coils along the y-axis is $b_n$ (not shown),

FIG. 8 shows (a) A diagram of a rectangular wire loop carrying current $I_1$ and second re-entrant loop carrying current $I_2$. The outer and inner loops are supported in a polymer matrix. The loop plane is arranged to be normal to the magnetic field B.

(b) A plan view of the wire loop arrangement of FIG. 8(a) above. Each half of the loop arrangement is set in a polymer resin and part of the gap between each half is filled with the same material with a central air gap or the whole gap is filled with a different material allowing mechanical coupling of each half of the loop assembly. As indicated the currents $I_1$ and $I_2$ in each half of the assembly are in anti-phase.

Figure 10:
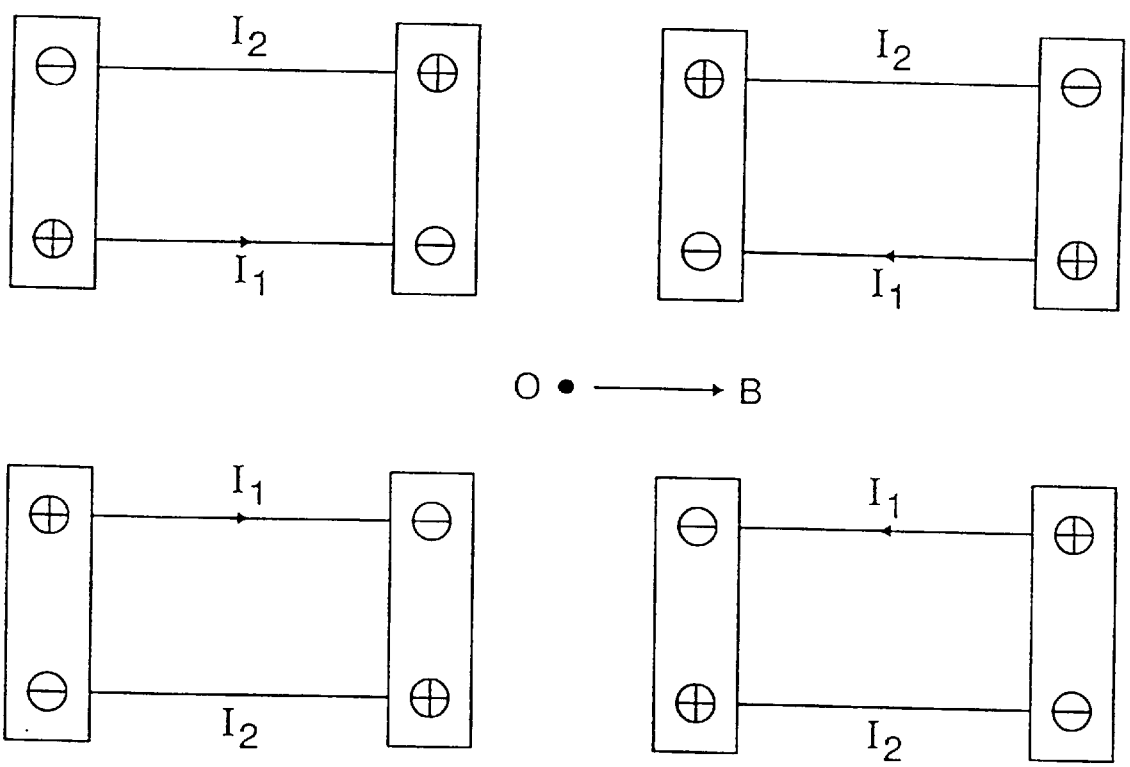

(c) An alternative mechanical coupling arrangement for each half of the plate allowing tensile as well as compressive net forces across the gap, FIG. 9 shows a plan view of an assembly of double rectangular loops of the type shown in FIG. 8, which are arranged to form at region O a magnetic field gradient which is transverse to the static field B. The outer loops of each quadrant carry a current $I_1$ and the inner re-entrant loops in each quadrant carry a current $I_2$. The conductors are set in a suitable polymer resin with either the same material with a central air gap or the whole gap is filled with a different material separating each half of each quadrant, FIG. 10 shows a plan view of assembly of mechanically coupled rectangular loops of the type shown in FIG. 4 carrying currents $I_1$ and $I_2$ as indicated. The assembly is arranged to produce at region O a magnetic field gradient which is transverse to the static field B,

FIG. 11 shows (a) A side elevation view of a single quadrant of a gradient set of the type indicated in FIG. 9 above but in which the rectangular loops are deformed into closed arc loops as indicated. The outer arc loop carries current $I_1$ and the inner Ha re-entrant arc loop carries current $I_2$. Because the outer loop is closed, $I_3=I_1$. The conductors are set in a suitable polymer resin with either the same material with a central gap or a different material in the gap separating each half of each quadrant, (b) An end view of a concentric cylindrical transverse coil with distributed windings of the fingerprint design which constitutes an open loop structure. Provided the coil build thickness t<<$\bar{a}$, the mean cylinder radius, the currents $I_1$, $I_2$ and relative phase $\phi$ are determined according to Eq. [26]. The coil is supported in a polymer matrix. Wire details are shown inset together with the gap which is filled with either the same material with a central gap or a different material.

FIG. 12 sketches showing the wire layout for the two geometries used to obtain experimental data. (a) The rectangular board layout. (b) The closed arc loop board layout. The board dimensions are shown on the diagrams. Each board was slotted with an air gap of 2 mm.

FIG. 13

(a) Sketch of a gradient set comprising many plates with spacers (shaded). The whole assembly is compressed under tension rods. The spacing material is an acoustic absorbent such as rubber, Vulcanite or something similar.

(b) Sketch of one spacer showing an embedded counter-wound cooling tube, (c) sketch of one y-gradient coil plate.

FIG. 14

(a) Sketch of current paths for an open loop acoustically controlled coil section with different arc angles subtended at point O.

(b) Wire path for a closed arc loop coil section with an acoustic screen forming a re-entrant loop. A slot is cut along the dotted line AB.

Figure 15:
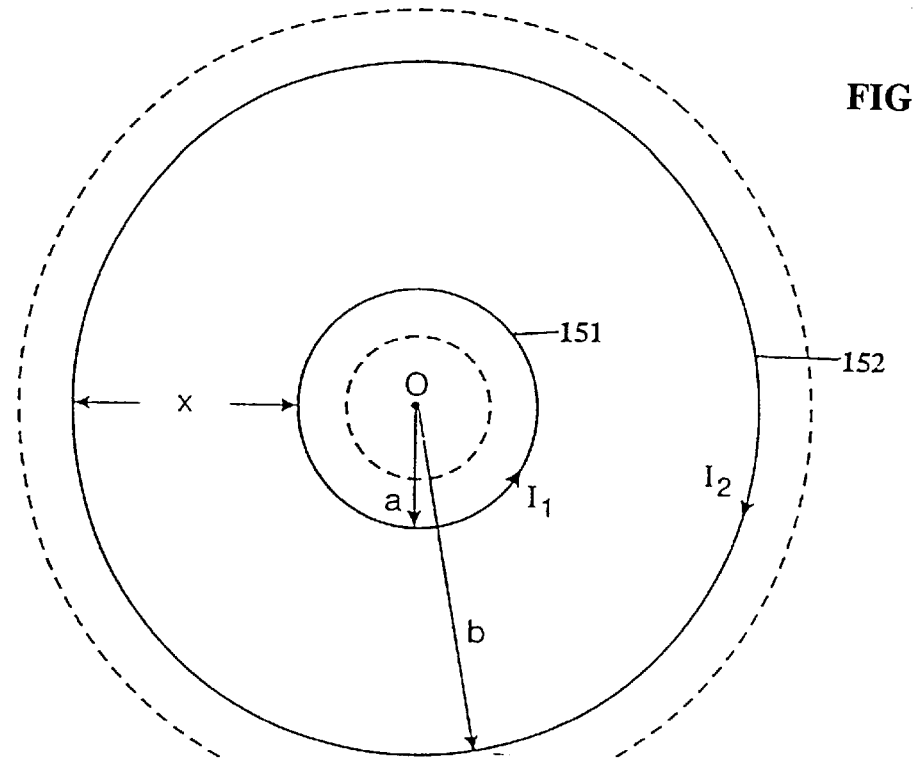

FIG. 15 sketch of current paths for an acoustically controlled hoop of radius a carrying current $I_1$ forming part of a z-gradient set. The acoustic shield carries a current $I_2$ in a second hoop of radius b coaxial and coplanar with the primary hoop. All wires are either inset or moulded into the board which is made of a suitable polymer resin. The dotted line indicates the board mounting for the wires.

Figure 16:
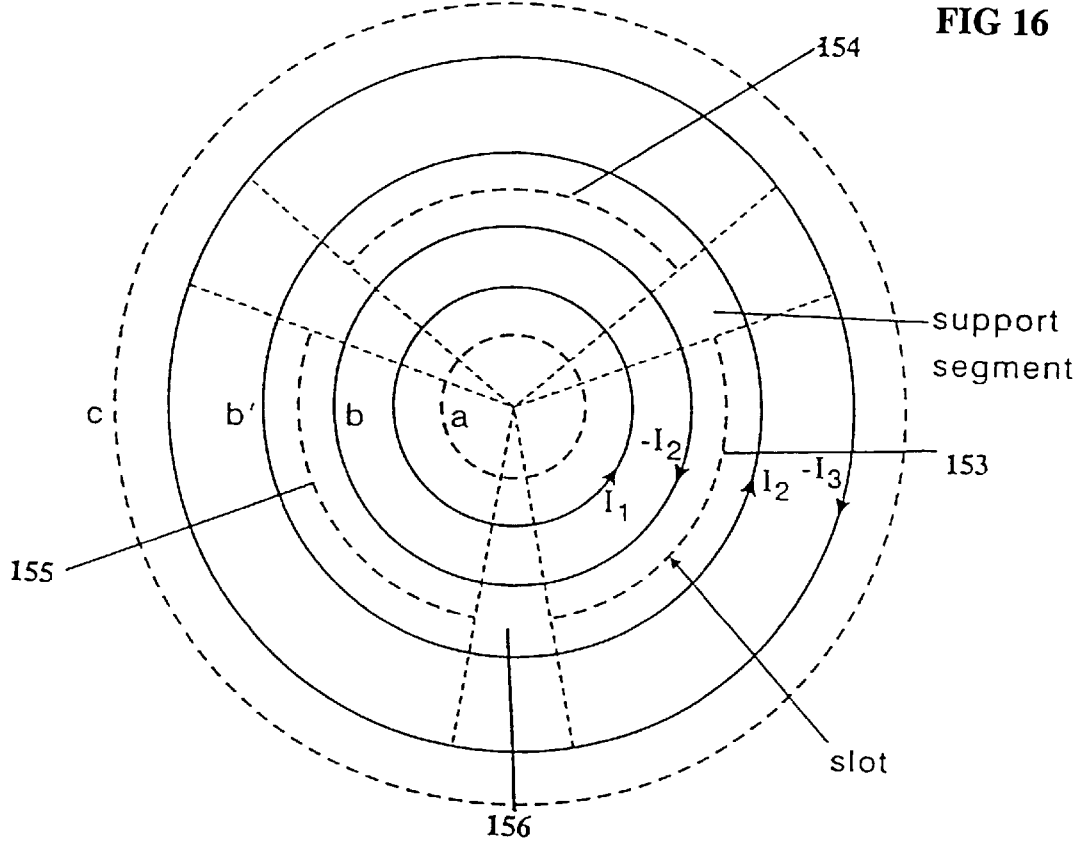

FIG. 16 Sketch of an alternative arrangement for acoustic control of a conducting hoop of radius a carrying a current $I_1$. The acoustic screen comprising wires at radii b, b' has a slot between the wires (dotted) with three support segments shown maintaining the integrity of the inner wire hoop currents ±$I_2$ flow through wires at radii b,b' respectively. A third current –$I_3$ flows through the outer hoop of radius c. All wires are either inset or moulded into the board which is made of a suitable polymer resin. The inner and outer dotted circles represent the board support dimensions.

FIG. 17

(a) Sketch showing integral magnetic screening and acoustic shielding of a primary hoop of radius a carrying current $I_1$. The magnetic screen lies on a cylinder of radius c. The acoustic shield is placed between the primary coil and the magnetic screen with currents ±$I_2$ on radii b,b'. In between the acoustic shield wires is a continuous thin slot. Two different support materials are used forming two concentric annular cylinders of radius and thickness a,$x_1$ and b',$x_2$ with characteristics $v_1$, and $v_2$,$\alpha_2$ respectively.

(b) Integral magnetic screening and acoustic shielding of a primary transverse gradient coil of the fingerprint design (not shown). The primary coil and half of the acoustic shield are potted in an inner cylindrical annulus. The magnetic screen and the other half of the acoustic shield are potted in an outer cylindrical annulus of different material to the inner annulus. The two cylinders are loosely coupled.

All wires are either inset into machined slots in the annular cylinders or moulded into them using suitable polymer resins.

Figure 18:
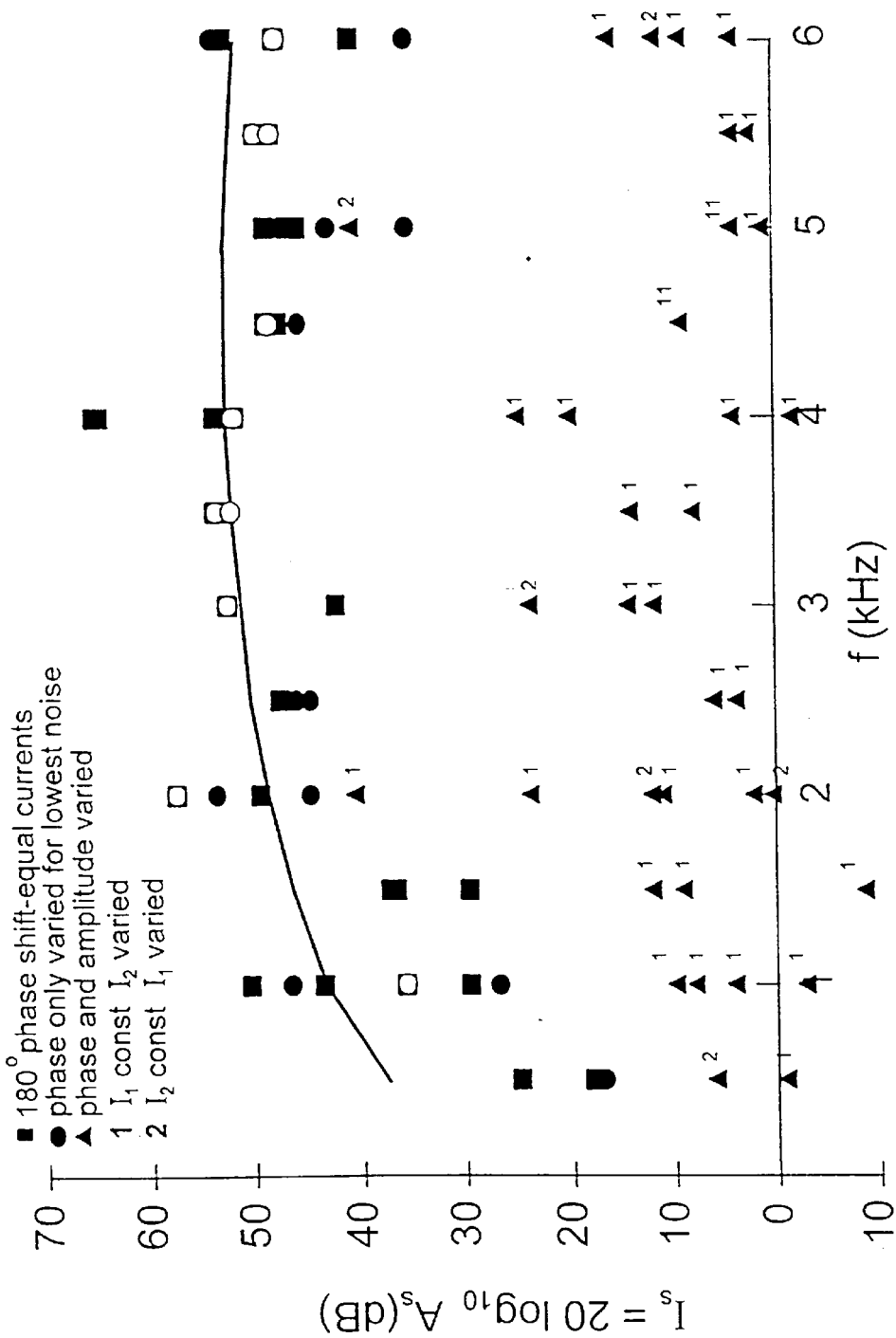

FIG. 18. A graph showing the acoustic output intensity $I_s$ versus f for the rectangular board arrangement of FIG. 12a. The squares correspond to data when $I_1=-I_2$. The curve is the theoretical expression Eq. [14] with $\theta=\alpha=0$. The triangles show the much reduced output when the acoustic shield is properly adjusted. The superscript 1 corresponds to $I_1$=10 A with $I_2$ varied. The superscript 2 corresponds to $I_2$=10 A with $I_1$ varied. These data indicate a residual attenuation which at some frequencies is better than –10 dB, see Eqs. [31 and 32].

Figure 19:
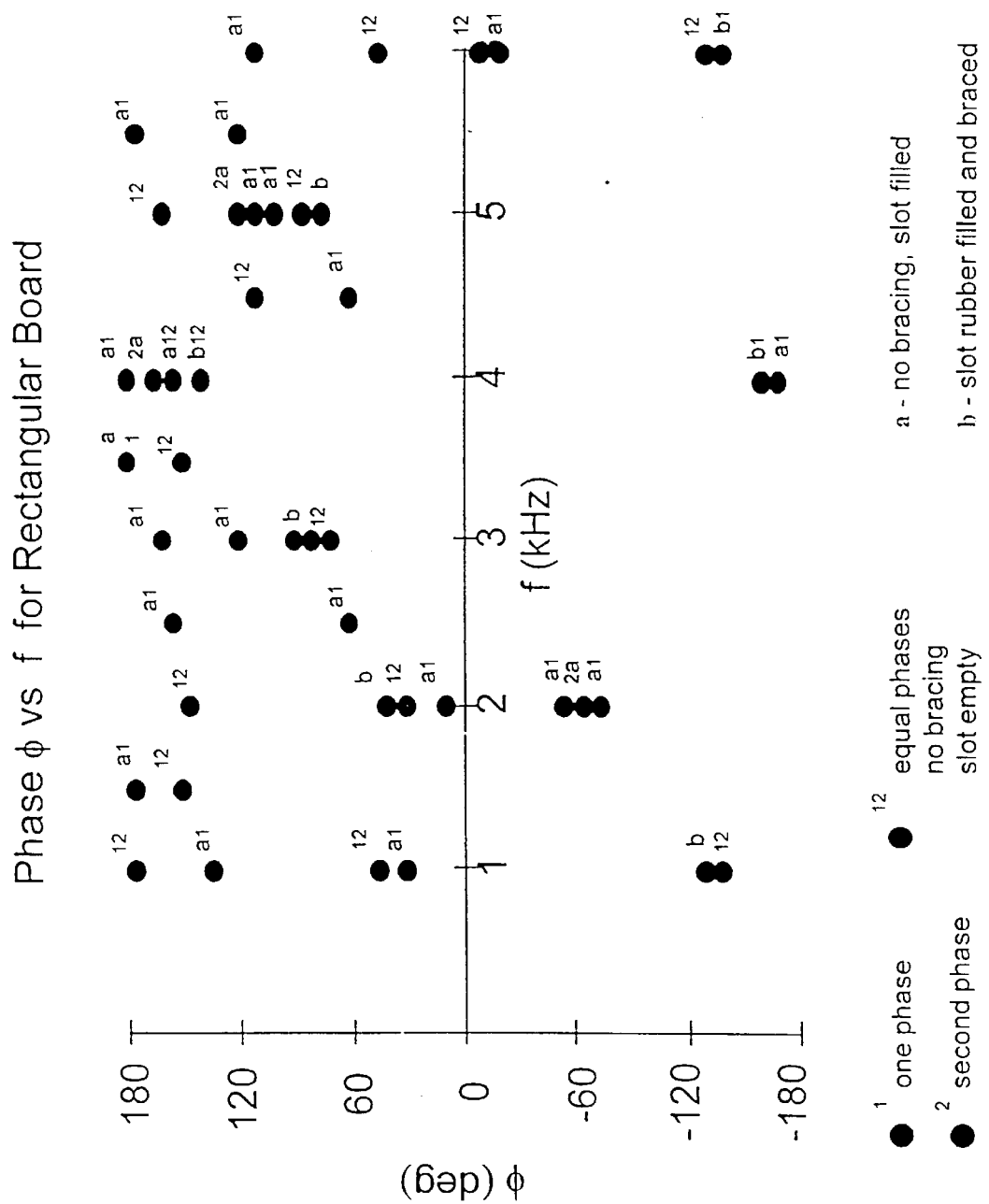

FIG. 19. Graph showing the variation of phase $\phi$ versus f corresponding to the data of FIG. 18.

Figure 20:
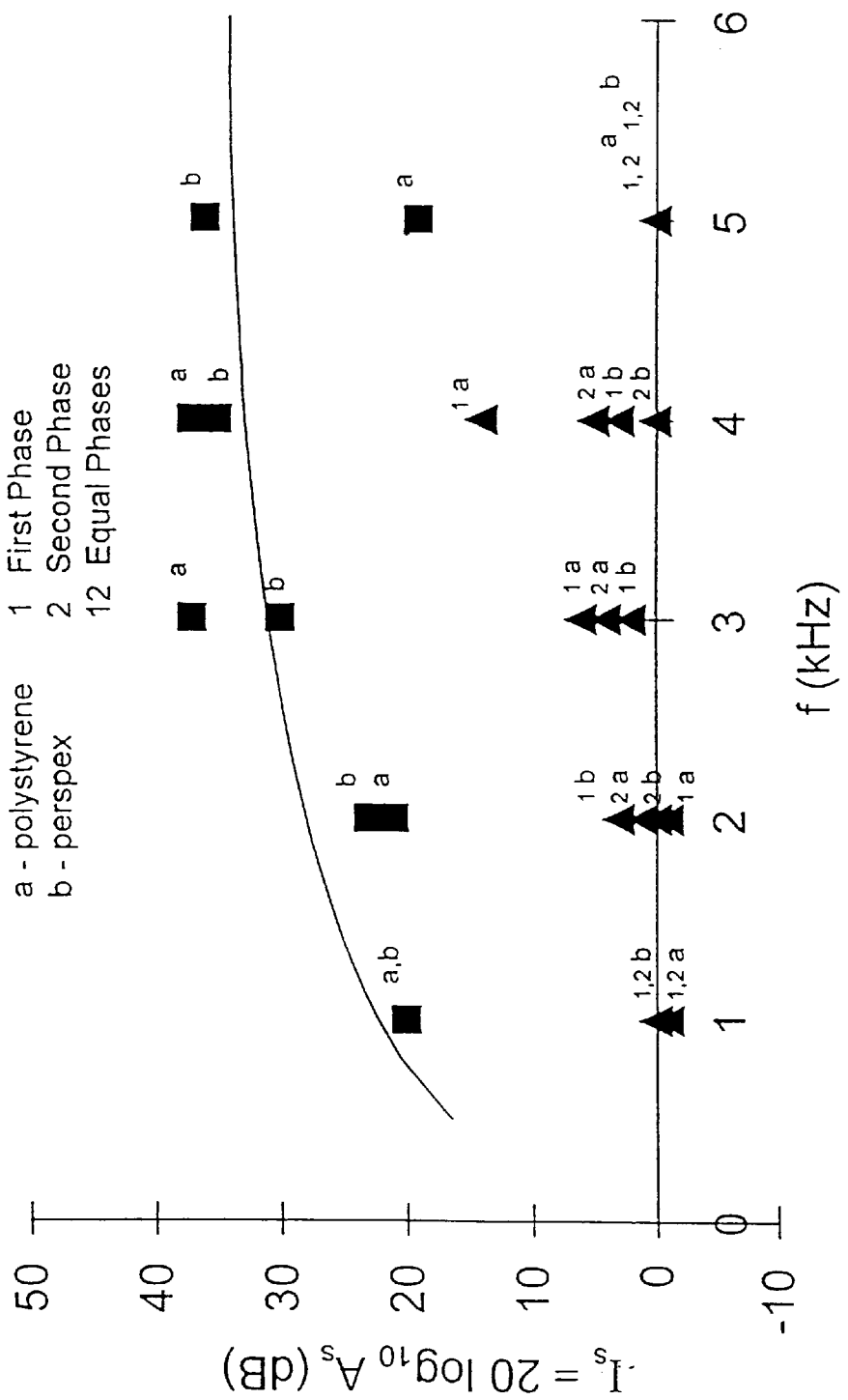

FIG. 20. A graph showing the acoustic output intensity $I_s$ versus f for the arcuate segment arrangement of FIG. 12b. The squares correspond to data when $I_1=-I_2$. The curve is the theoretical expression Eq. [14] with $\theta=\alpha=0$. The superscripts a and b refer to the board material, polystyrene or Perspex respectively. The triangles show the much reduced output when the acoustic screen is properly adjusted. The superscript 1 corresponds to $I_1$=10 A with $I_2$ varied. The superscript 2 corresponds to $I_2$=10 A with $I_1$ varied. These data indicate a residual attenuation which at some frequencies is around 0 dB, see Eqs. [50 and 61].

Figure 21:
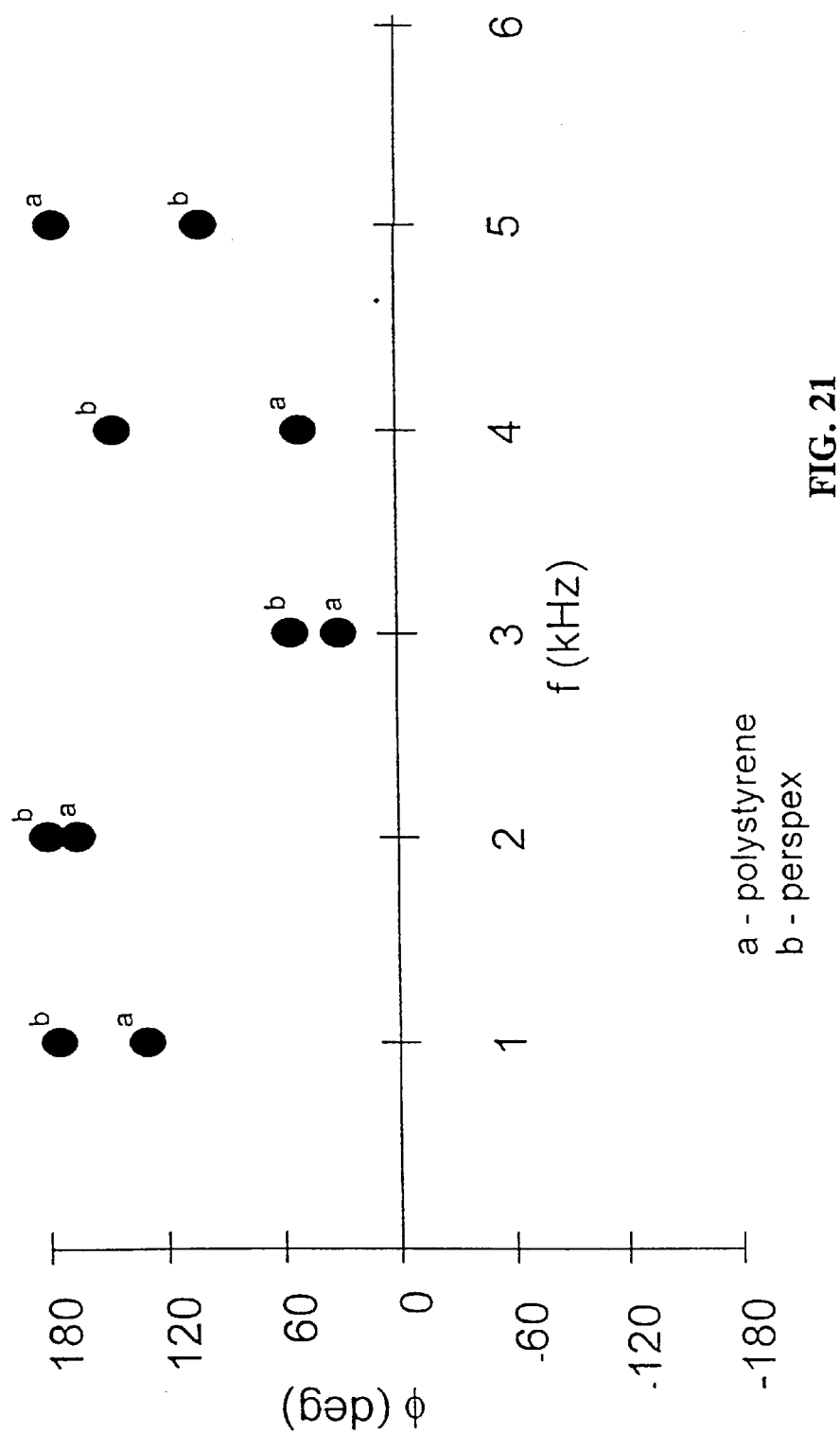

FIG. 21. Graph showing the variation of phase $\phi$ versus f corresponding to the data of FIG. 20. The superscripts a and b refer to the board material, polystyrene or Perspex respectively.

Figure 22:
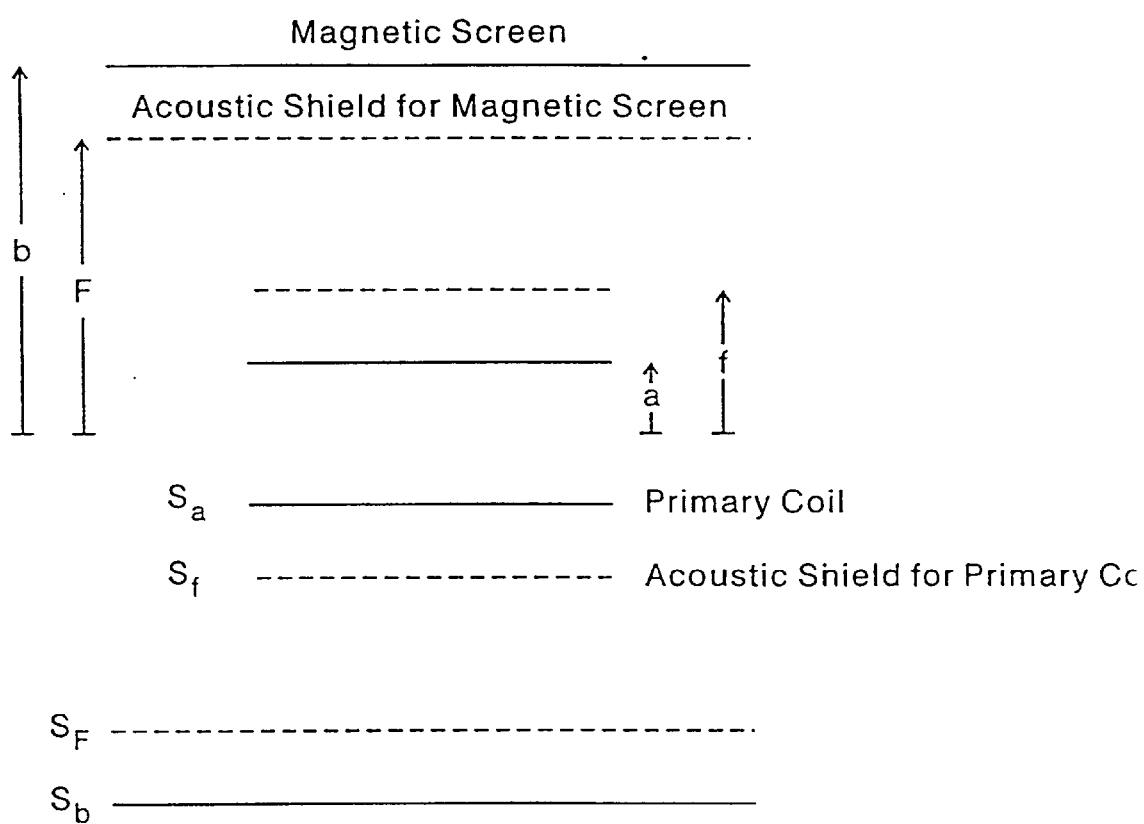

FIG. 22. Sketch showing the side elevation (solid line) for an active magnetically screened coil with primary radius a and magnetic screen radius b. Also shown in dotted lines are the positions of the acoustic shields. The primary coil acoustic shield has a radius f and the acoustic shield for the magnetic screen has a radius F.

The invention will now be described with reference to the drawings.

Basic Principles

A conductor element l=l$\eta$ carrying a current I placed in a uniform magnetic field B=Bk, will experience a Lorentz force F=F$\zeta$ per unit length given by $$F = I l \times B = \zeta B I \sin \delta \quad (1)$$

where $\delta$ is the angle between the conductor and the field direction and $\eta$, $\zeta$ and k are unit vectors which lie along the conductor direction, the force direction and magnetic field direction respectively. When $\delta=0$, F=0 and when $\delta=90°$, F is a maximum. If the conductor could be firmly fixed to an immoveable coil former so it did not move or flex when energised, no sound would be produced.

In a practical coil system the mass of the coil former can be increased in the hope of making it effectively immoveable. But with high static magnetic fields and the very high currents now being used to generate the gradients in high-speed imaging techniques, the magnetic forces are so large that it is impossible to create an effectively immoveable mass.

In its simplest form the active force balance approach utilises a pair of mechanically coupled straight parallel wires carrying equal and opposite currents. The arrangement is shown in FIG. 1 for a pair of wire elements, each of mass m, coupled by springs of coupling constant $\kappa$. The plane through the wires is arranged to be normal to the field B.

Active force balanced coils

Using the above-active force balance principle we consider a rectangular loop of conductor carrying a current I and placed in a magnetic field B, FIG. 2. Provided that the plane of the coil loop is normal to the B field direction, all forces F,F', in the conductors are equal and opposite for any sense of the current I. If these forces are coupled via non-compressive struts and ties, all net forces in the system are balanced. In addition all moments, couples and therefore torques are cancelled.

It is clear that if non-compressive materials are used, the conductors themselves cannot move. In this case no sound will be generated in such a coil arrangement. Of course the whole coil structure can be flooded or potted with a suitable plastic resin or recessed into a block of material to replace the individual struts and ties by effectively a continuum of struts and ties.

Compressive Struts

All solid materials have visco-elastic properties. This means that the noise cancellation described above will have some limitations insofar that there will be some residual movement of the conductors. Sudden movement of the conductors will send a compressional wave with a progressively attenuated amplitude through the material. The velocity of such a wave v is given by $$v = \sqrt{(E/\rho)} \quad [2]$$

where E is Young's modulus and p is the density of the material.

The velocity and wave length $\lambda$ are related by $$v = f\lambda \quad [3]$$

where f is the frequency of the propagated wave.

Acoustic Control Theory

Figure 3A:
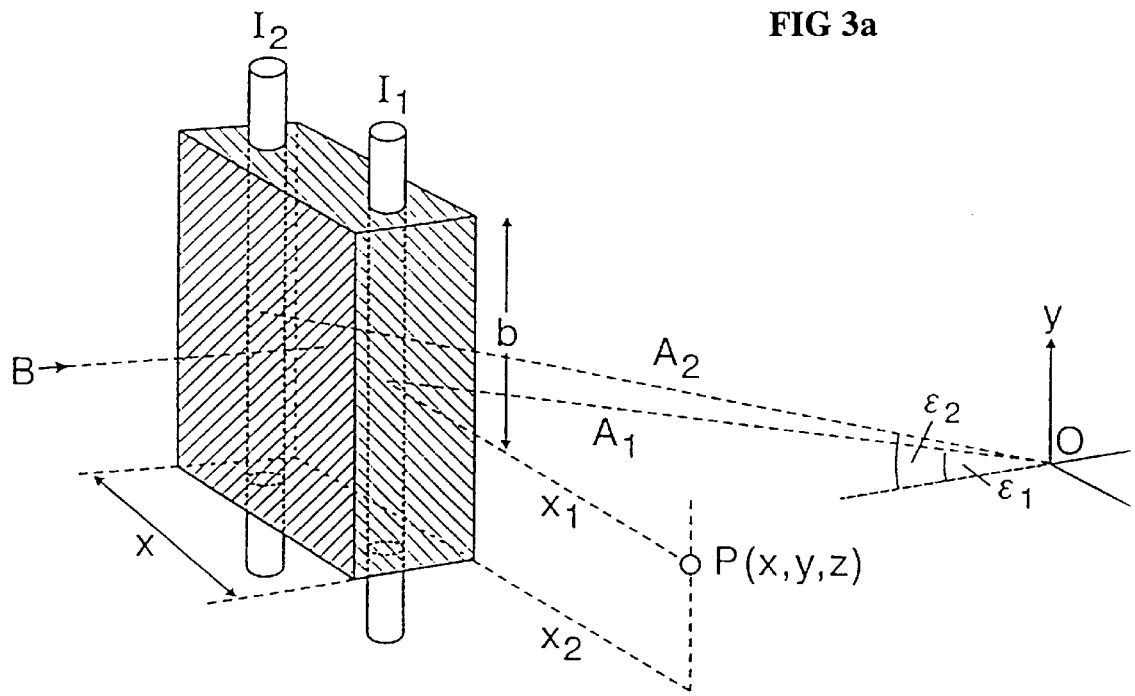
Figure 3B:
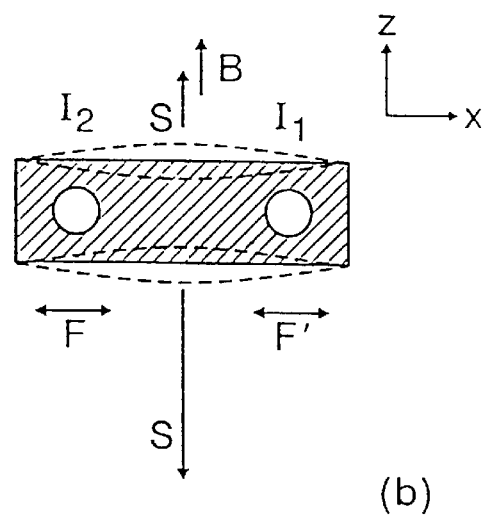

For simplicity we consider two straight parallel wires spaced a distance x and mechanically coupled by a block of length b, FIG. 3a. We consider generalised compressive/expansive displacements of the block at the positions of the two wires. We consider the case when wires are driven by currents of amplitudes $I_1$, $I_2$ and with a phase difference $\phi$. Each wire launches a plane acoustic wave in the solid. The waves give rise to a net transverse acoustic source amplitude $A_S$ at the wire positions given by $$A_S = A_1 e^{i\omega t} e^{ikx} e^{-\alpha x} + A_2 e^{i(\omega t + \phi)} \quad [4]$$

where $A_1$ and $A_2$ are the initial wave amplitudes at each wire position which are proportional to $I_1$ and $I_2$ respectively, $\omega = 2\pi f$ in which f is the applied frequency of the driving current in the coil, k is the wave propagation constant in the polymer block given by $$k = 2\pi f/v \quad (5)$$

and $\alpha$ is the wave attenuation per unit length. We assume that this transverse motion gives rise to wave propagation, S, of related form to Eq. [4] along the z-axis, through the transducer action of the block as sketched in FIG. 3b. Acoustic measurements can be made with either one or both wires powered. For just one wire the unscreened acoustic source amplitude $A_{S1}$ is given by $$A_{S1} = A_1 e^{2i\pi ft}, \quad [6]$$

where in general $A_1 \neq A_1$ because of potential macroscopic translations of the block. Let the phase $\phi$ be split into two components given by $$\phi = \pi + \theta. \quad [7]$$

Let us now write the amplitude $A_2$ as $$A_2 = A_1 e^{-\beta} \quad [8]$$

where $\beta$ is real number such that the factor $e^{-\beta}$ is an attenuation term. Because $A_1 \propto I_1$ and $A_2 \propto I_2$ we may write the current $I_2$ as $$I_2 = I_1 e^{-\beta}. \quad [9]$$

Since $I_2$ is under experimental control, variation of $I_2$ effectively introduces a non-zero value of $\beta$. Using Eqs. [7] and [9] we rewrite Eq. [4] as $$A_S = A_1 e^{i\omega t}(e^{ikx}e^{-\alpha x} - e^{i\theta}e^{-\beta}). \quad [10]$$

When $\beta = \alpha x$ and by changing the phase such that $\theta = kx$, it is possible to make $A_S = 0$. Both $\theta$ and $\beta$ are experimentally accessible quantities. The above conditions which make Eq. [10] vanish constitute the new principle of active acoustic control. In the special case that $\beta = \alpha x$ only Eq. [10] gives $$A_S = A_1 e^{i\omega t} e^{-\alpha x} e^{i(kx+\theta)/2} [e^{i(kx-\theta)/2} - e^{-i(kx-\theta)/2}] \quad [11]$$

$$= A_1 e^{i\omega t} e^{-\alpha x} e^{i(kx+\theta)/2} 2i\sin[(kx-\theta)/2].$$

The emitted sound intensity in decibels, $I_S$, for this arrangement is therefore proportional to $$I_S = 20 \log_{10}\{2 A_1 e^{-\alpha x} \sin[(kx-\theta)/2]\}. \quad [12]$$

The emitted sound intensity in decibels for a single wire is $$I_{So} = 20 \log_{10}[A_1]. \quad [13]$$

The relative attenuation, A, of the emitted sound intensity in decibels is therefore given by $$A = I_{So} - I_S \quad [14]$$

$$= -20\log_{10}\left([2A_1/A_1]e^{-\alpha x}\sin\left[\left(2\pi\frac{fx}{v} - \theta\right)/2\right]\right).$$

Thus for a given v and f, $\theta$ can be chosen to give an infinite value of the relative noise attenuation of emitted sound intensity. We point out that in addition to $\theta$ in Eq. [14] there are many other values which will satisfy the condition of infinite attenuation. For example $\theta \pm n\pi$ will also satisfy the condition. We return to this point later in the experimental section. Of course, if $\alpha$ is itself a function of frequency, it will be necessary to adjust $\beta$ for each value of f.

Theoretical Phase

If the sound propagation velocity, v, in the solid material is independent of frequency, a sound pulse initiated on one side of the solid will arrive at distance x delayed by a time interval $\tau$ given by $$\tau = x/v. \quad [15]$$

The corresponding phase delay for the assembly at frequency f which makes Eq. [14] vanish is therefore $$\theta = +\omega\tau \pm n\pi = +2\pi f\tau \pm n\pi. \quad [16]$$

Thus $\theta$ is proportional to f and is zero for f=0. Substitution into the total phase $\phi$, Eq. [7], gives $$\phi = \pi(1 \pm n) + 2\pi f\tau. \quad [17]$$

In our case due to hardware limitations n can take on only the values n=0, ±1, giving three equations which describe the phase variation with frequency.

The introduction of this new principle of active acoustic control means that the choice of polymer resin or support material is less critical. Complete compensation of both wave propagation phase and wave attenuation is now possible.

Experimental Arrangement

In order to test the theory developed in §5 above, a test coil arrangement was made comprising two parallel flat rectangular coils each capable of being driven independently from its own current source with currents $I_1$ and $I_2$. The arrangement is shown in plan view in FIG. 4. The shaded regions in FIG. 4 were potted in solid polystyrene so as to encase the active current carrying wires. The wires in each end section therefore behave as a parallel pair corresponding to FIG. 3a. The second potted pair of wires is part of the current return path for each separate coil. Because of the geometrical arrangement, currents flowing along the direction of B experience no Lorentz forces. Sound, S, is emitted along a direction normal to each block face as indicated.

The coils were constructed with 10 turns of wire each, with coil dimensions a=40 cm and b=40 cm. The two coils were mounted coaxially with their planes parallel to B and spaced 7.5 cm apart.

The block diagram circuit of FIG. 5a shows the experimental arrangement. It comprises a Hewlett Packard network analyser (HP8751A) which provides an AF source and received signal display. The AF output is fed via a phase splitter to two Techron amplifiers. The phase splitter provides two low voltage AF signals of independently adjustable amplitude and relative phase, i.e. $V_1, \phi_1$ and $V_2, \phi_2$. The Techron outputs are fed separately to each coil of the test assembly. The test assembly is placed in a magnetic field with the field along the direction indicated in FIG. 4.

Sound emitted from the test coil is picked up with an electret microphone (type RS 250–485) centrally placed (point P of FIG. 4) at about 1 m from the emitter surface. The microphone output was fed through a 20 dB gain preamplifier back to the network analyser input R. The network analyser was also used, via its A and B inputs, to monitor the current amplitudes and phase.

For operation in a pulsed mode the circuit of FIG. 5b is inserted between points P,P' and Q,Q' of the circuit of FIG. 5. In this arrangement switches $S_1$ and $S_2$ switch out the phase splitter input and switch in the pulse generators PG1 and PG2 which for non-dispersive wire support materials produce shaped output pulses of independently variable amplitudes and shapes. These now form the input signals to the gradient drive amplifiers. Each pulse generator is triggered via adjustable delays D1 and D2 with respect to a common trigger input T FIGS. 5(a) and (b). In general D1 can be set to zero and D2 varied together with the pulse amplitude of PG2 to minimise the acoustic noise output. For acoustically dispersive coupling materials it is necessary to monitor the wave shape arriving at the far side of the support block. This waveform is then used to generate the amplitude and shape of the output waveform of PG2.

Experimental Results

Figure 6A:
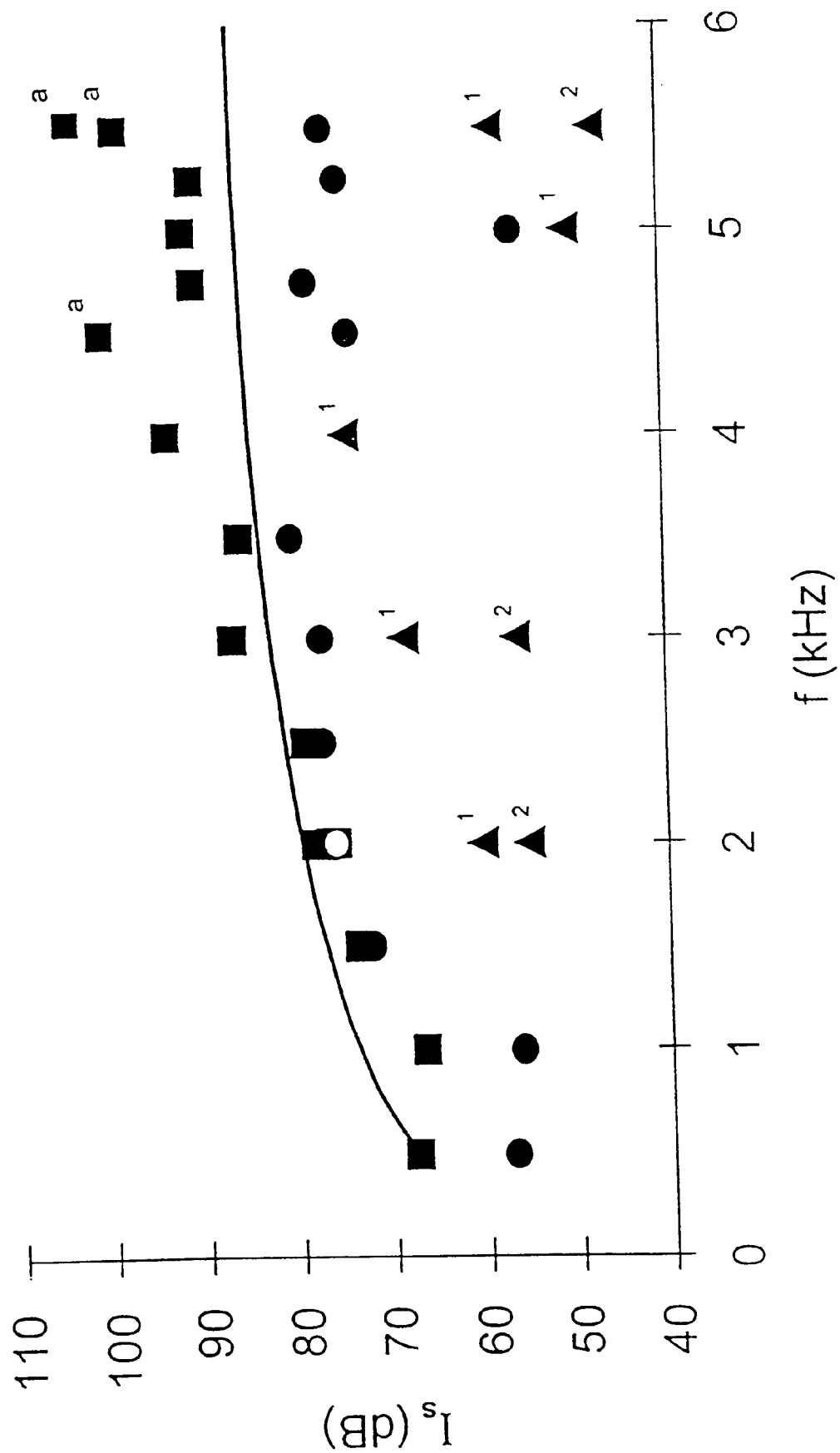

FIG. 6(a) shows experimental acoustic noise output data when both coils are supplied with sinusoidal currents under a range of conditions. The square data points were obtained when $I_1 = -I_2 = 20$ A. The theoretical curve, Eq. [12], is also plotted for the case $\alpha=0$ and $\theta=0$ with 20 $\log_{10} A_1 = 80$ dB, $V = 0.975 \times 10^3$ ms$^{-1}$ and x=0.075 m. The value of v was chosen for optimum fit. Calculated values of v for polystyrene lie in the range $(1.15–2.02) \times 10^3$ ms$^{-1}$. The points $\square^a$ are rogue data due to Chladni resonances or structural buckling modes. They are included for completeness but are irrelevant to compressional wave theory.

Figure 6B:
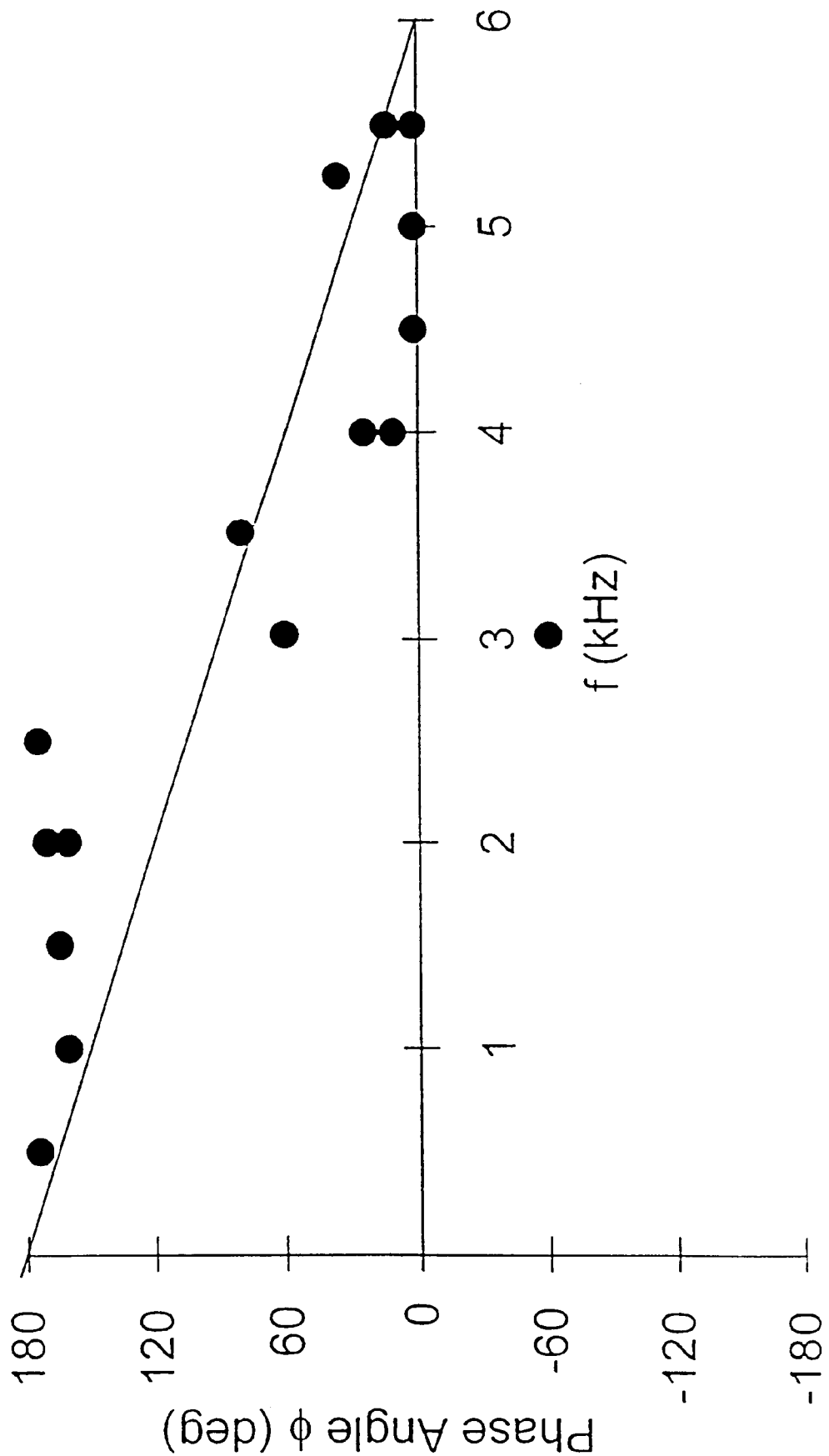

The circular data points were obtained by varying the phase $\theta$ from the 180° condition to give a minimum noise output. The experimental phase is shown in FIG. 6(b). The straight line is the theoretical phase, Eq. [17], with $\tau=83$ $\mu$s corresponding to a sound velocity v=0.9 kms$^{-1}$ in the block. Further reduction in noise output was obtained by varying the amplitude of either $I_1$ or $I_2$. This is equivalent to introducing a non-zero value of $\beta$ in Eqs. [9] and [10]. These results correspond to the triangular data points. Referring to Eqs. [9 and 10] we see that either $I_2$ can be decreased or $I_1$ increased to make $A_S=0$ when $\theta=kx$. That is to say, the ratio $I_2/I_1 = e^{-\beta}$ can be achieved in two ways for fixed $\beta$. The superscript 1 refers to an increase in $I_1$ for $I_2=20$ A whereas the superscript 2 refers to a decrease of $I_2$ when $I_1=20$ A. While all triangular points show a considerable noise reduction, as expected the $\Delta^2$ points give the best results.

The experimental procedure was to set phase first and then adjust amplitude. A better approach, not followed in this Section but used later is to iterate the procedure in order to optimise the overall noise attenuation performance. One surprising feature of the data is the dramatic noise reduction of ~40 dB at around 5.5 kHz. This frequency corresponds approximately to half-wavelength resonance of the block, where sound output is normally a maximum. The large changes in acoustic output support the theoretical predictions of Eq. [14] and confirm the essential correctness of our approach. We note that for a loss-less material, A would peak periodically at higher frequencies. This behaviour has not been observed in our experiments using polystyrene as the potting material because $\alpha \neq 0$. Indeed, from the measured values of $\beta$ using Eq. [9] we find a small variation of $\alpha$ with frequency as follows: f=2.0 kHz, $\beta=0.28$, $\alpha=3.76$ m$^{-1}$; f=3.0 kHz, $\beta=0.47$, $\alpha=6.26$ m$^{-1}$; f=5.5 kHz, $\beta=0.21$, $\alpha=2.76$ m$^{-1}$.

Gradient Coils

General Principles

For simplicity, we shall consider gradient coils made up of pairs of finite length straight wire sections essentially as shown in FIG. 3. The smallest number of conductor pairs to form a transverse gradient coil is 4. The first quartet of pairs in a set of n quartets is shown in FIG. 7. The current in all 4 inner wires must have the same sense for either a $G_X$ (shown) or $G_Y$ arrangement. The gradient field is the sum of magnetic fields from all 8 wires. We shall consider one wire of one quadrant of the quartet to carry a current $I_1$. For active acoustic screening of this wire we require a second wire carrying a current $I_2$ and mechanically coupled to the first, see FIG. 3. The z-component of magnetic field $B_P(x,y,z)$ at a distant point P(x,yz) is given (V. Bangert and P. Mansfield, Magnetic field gradient coils for NMR imaging. J. Phy. E. Sci. Instrum., 15, 235–239 (1982) by $$B_P = -(\mu_o/4\pi)((x-D_1)g_1I_1 - (x-D_2)g_2I_1 e^{-\beta}e^{i\theta})e^{i\omega t}. \quad [18]$$

where $$D_{1,2} = A_{1,2} \tan \epsilon_{1,2} \quad [19]$$

and $$g_{1,2} = \int_{-y_1}^{y_1} dy_W[(y - y_w)^2 + (x - A_{1,2})^2 + (z - D_{1,2})^2]^{-3/2}. \quad [20]$$

where $Y_W$ is the distance along the wire and $A_{1,2}$ are the normal distances of the wires to the y-axis (see FIG. 3). The angles $\epsilon_{1,2}$ are defined in FIG. 3. When $\theta=0$ in Eq. [18] the magnetic field at P from the first wire is reduced by the negative field from the second. However, at a frequency sufficiently high to make the connecting block resonate at $\lambda/2$, $\theta=\pi$. In this case the two currents become in-phase and magnetic fields for each wire now add. This will have important implications in some quiet gradient coil designs by increasing their efficiency.

Practical Gradient Arrangements

The principles of active acoustic control can be immediately applied to the design of gradient coils (P. Mansfield, B. Chapman, P. Glover and R. Bowtell, International Patent Application, No. PCT/GB94/01187; Priority Data 9311321.5, Jun. 2, (1993). (P. Mansfield, P. Glover and R. Bowtell, Active acoustic screening: design principles for quiet gradient coils in MRI. Meas. Sci. Technol. 5, 1021–1025 (1994). (P. Mansfield, B. L. W. Chapman, R. Bowtell, P. Glover, R. Coxon and P. R. Harvey, Active acoustic screening: Reduction of noise in gradient coils by Lorentz force balancing. Magn. Reson. Med. 33, 276–281 (1995)). As discussed above we can design a transverse gradient coil from four or more rectangular loops as indicated in plan view for FIG. 7 to produce an x gradient, $G_x$. In this arrangement each quartet of loops has a width $a_n$, length $b_n$ and comprises $N_n$ turns of conductor. The current in successive quartets of loops is equal to $I_n$. The plane separation for the nth quartet is $2z_n$ and the in-plane loop displacement is $a_n+X_n$. In such a coil arrangement the forces and torques cancel. A spatially more uniform magnetic field gradient is achieved with n>1.

Because most whole-body imaging systems use cylindrical static magnetic field symmetry, the rectangular loops described in FIG. 7 can of course be deformed into arcs. Provided the arcs form closed loops, the planes of the loops are normal to the magnetic field B, and provided the coil wires are mechanically coupled by struts or by potting in a resin, all torques and forces balance just as in the case of a rectangular loop. This result is true for any closed loop carrying a current I which is confined to a plane and where $\delta=90°$, Eq. [1], since the line integral of the Lorentz force around the loop $$\oint dF = 0. \quad [21]$$

This result can be generalised to line integrals where the current in the loop varies, i.e., $$\sum_i \int_i dF_i = -\sum_i \int_i B \times I_i dl = 0 \quad [22]$$

where $I_i$ is the current flowing in the ith segment of the contour. In this form force balance is achievable with open current loops. The test coil arrangement of FIG. 4 is an example of an open current loop, Eq. [22], where the return currents are zero in the x-y plane. We emphasise however that for active acoustic control, the line integral, Eq. [22] does not vanish, a feature which distinguishes the present invention from the prior art.

New gradient Coil Arrangements

Figure 8C:
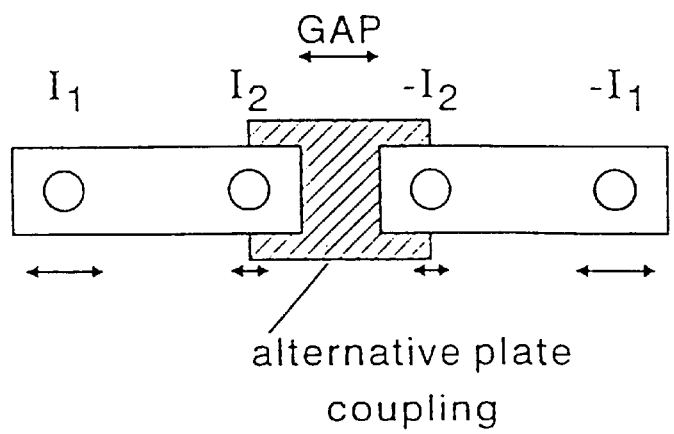

From the new principle of active acoustic control which utilises current amplitude and phase adjustment, we construct a flat rectangular coil arrangement which comprises an outer closed loop carrying a current $I_1$ and an inner re-entrant narrower loop carrying a current $I_2$ as shown in FIG. 8a. In a first embodiment both loops are supported by a polymer matrix as indicated in FIG. 8b. The supporting matrix material is split centrally and the gap filled as shown in FIG. 8b. The material in the gap is preferably another polymer or rubber. In order to maintain the integrity of the two halves of the plate assembly, an alternative coupling of the plates is shown in FIG. 8c. This arrangement ensures coupling under both tensile and compressive forces. Seen in plan view, FIG. 8b, each half of the plate looks like a separate coil. However, the distinguishing feature over prior art is that $I_1 \neq -I_2$ because of both phase and amplitude. The net effect of this is that overall the Lorentz forces within each half of the plate do not balance. However, the forces of both halves of the assembly do balance. Wave propagation within each half of the assembly is quenched provided $|I_1/I_2|$ and the relative phase are chosen properly. Each half of the plate assembly moves in unison compressing or stretching the coupling material. Since the gap is arranged to be narrow, wave propagation phase effects across the gap are effectively negligible for most coupling materials.

In a second embodiment as shown in FIG. 8A two blocks of material BL1 and BL2 are used to maintain the mechanical integrity of the two halves of the coil assembly. The blocks can be the same as the supporting material. The remaining gap can be an unfilled air gap.

The new rectangular plate units can be built up to form transverse gradient sets as shown in FIG. 9. That is to say each quadrant of the quartet of rectangular coils shown in FIG. 7 is now replaced by the closed loop arrangement shown in FIG. 8.

The basic test coil arrangement of FIG. 4 can also be used to make a gradient set as shown in FIG. 10. However, the net Lorentz forces within each quadrant of this arrangement are not zero. This arrangement would therefore generate large bending moments overall.

Finally, the new principle of active acoustic control can be applied to cylindrical coil geometries. For example, the rectangular coils can be deformed into arcuate units one of which is shown in FIG. 11a. These units in turn can be used as the basic building block for transverse gradient coil assemblies. Other cylindrical geometries include the distributed transvese gradient designs of which the fingerprint coil is an example. In this arrangement two pairs of coils are arranged as in FIG. 11b.

Deformation of straight wires into arcs means that Eq. [10] no longer holds since, for a common angular displacement, the wire lengths on different arc radii are not equal. The radius of the inner wire arc is a and carries a current $I_1$. The radii of the middle pair of wires are b and b' and carry currents $\pm I_2$ and the radius of the outer wire is c and carries a current $-I_3$. The important feature is that the Lorentz forces are balanced between the cylinders. The Lorentz forces are all proportional to the product of current and arc length. Let the Lorentz forces at the arc radii of FIG. 11(b) be $F_a$, $F_b$, $F_{b'}$ and $F_c$. If the inner pair of coils is closely spaced, we may take $F_b$ equal to $F_{b'}$ without appreciable error.

Provided the radial build of the coil arrangement, $t<<\bar{a}$, the average radius of the coil assembly, we may assume plane wave transmission of the acoustic wave between cylinders. In this case Eq. [4] may be rewritten for the two open loop sections as $$A_S = e^{i\omega t}[(A_a e^{ikr_1} e^{-\alpha r_1} + A_b e^{i\phi}) + (A_{b'} e^{i\phi} + A_c e^{ikr_2} e^{-\alpha r_2})] \quad [23]$$

where $A_a$, $A_b$, $A_{b'}$, and $A_c$ are the initial wave amplitudes at each wire position. The Lorentz forces on each wire arc are given by $$F_a = a\psi_a I_1;\ F_b = F_{b'} = \pm b\psi_b I_2;\ F_c = -c\psi_c I_3; \quad [24]$$

where $\psi_a$, etc., are the angular displacements of the arcs. In the following we take these displacements to be all equal to the azimuthal angle $\psi$. The wave amplitudes in Eq. [23] are all proportional to their respective Lorentz forces, i.e.

$$A_a = \Lambda F_a,\ \text{etc.}, \quad [25]$$

where $\Lambda$ is a constant. Making these substitutions in Eq. [23] we obtain $$A_S = \Lambda \psi e^{i\omega t}\left[aI_1\left(e^{ikr_1}e^{-\alpha r_1} + \frac{bI_2}{aI_1}e^{i\phi}\right) - cI_3\left(e^{ikr_2}e^{-\alpha r_2} + \frac{bI_2}{cI_3}e^{i\phi}\right)\right]. \quad [26]$$

If we now take $r_1 = r_2 = r$ and let $\phi = \pi + \theta$, Eq. [7], Eq. [26] then becomes $$A_S = \Lambda \psi[aI_1(e^{ikr}e^{-\alpha r} - e^{-\beta_1}e^{i\theta}) - cI_3(e^{ikr}e^{-\alpha r} - e^{-\beta_2}e^{i\theta})]. \quad [27]$$

where we have substituted $bI_2/aI_1 = \exp(-\beta_1)$ and $bI_2/cI_3 = \exp(-\beta_2)$. We choose $kr = \theta$ which then allows the phase term to be factored out. We also note that since $|F_a| = |F_c|$, $aI_1 = cI_3$ for constant arc angle. This means that $\beta_1 = \beta_2 = \beta$. Finally by choosing $\beta = \alpha r$, the whole expression, Eq. [27], can be made to vanish.

In the arrangement of FIG. 11b the inner pair of coils at radii b, b' plays the same role as the re-entrant narrow loop in a straight set of Lorentz force balanced conductors. The gap between the inner pair of coils is filled with a coupling material which is preferably different to the general supporting polymer potting material. The same principle can be used to form acoustically controlled single arc and distributed arc saddle geometry transverse gradient coils.

In all the above conductor arrangements the arc loops may be connected in either a series or a parallel arrangement or a combination of both. In all cases the connections to the arcs must be made in such a way that the feeder and connector wires or conductors are in pairs running parallel with the main magnetic field B and preferably set in a plastic resin in the final wiring arrangement.

Magnetic Screening with Active Acoustic Control

Acoustically controlled coils can also be magnetically screened to circumvent the eddy current problem using the principles of active magnetic screening introduced by Mansfield and Chapman ((P. Mansfield and B. Chapman, Active magnetic screening of gradient coils in NMR imaging. J. Mag. Res. 66, 573–576 (1986), (P. Mansfield and B. Chapman, Active magnetic screening of coils for static and time-dependent magnetic field generation for NMR imaging. J. Phys. E. 19, 540–545 (1986)). Several ways of doing this are possible by adding extra magnetic screening coils to the assembly. General details are described elsewhere ((P. Mansfield, B. Chapman, P. Glover and R. Bowtell, International Patent Application, No. PCT/GB94/01187; Priority Data 9311321.5, Jun 2, (1993), (P. Mansfield, P. Glover and R. Bowtell, Active acoustic screening: design principles for quiet gradient coils in MRI. Meas. Sci. Technol. 5, 1021–1025 (1994)) and would be obvious to one skilled in the art.

Pulses

We have discussed so far the situation when gradients take the form of continuous modulated sine waves. However, there are many applications in imaging where pulse gradients are required. We consider a square pulse with a ramped leading edge which is applied to the test coil. For an acoustically non-dispersive support block application of $I_1$ will launch a wave through the material at time t and arrive at the other side of the block at time t+τ. The application of $I_2$ should therefore be delayed by τ with respect to $I_1$ in order to balance the Lorentz forces. An experimental arrangement for achieving this is shown in FIGS. 5a and b.

If the pulses are in the form of a regular sequence of trapezoids, the trapezoidal waveform for $I_1(t)$ may be represented by a Fourier sequence of the form (P. Mansfield, P. R. Harvey and R. J. Coxon, Multi-mode resonance gradient coil circuit for ultra high speed NMR imaging. Meas. Sci. Technol. 2, 1051–1058 (1991).

$$I_1(t) = I_o \Sigma a_n \sin n\omega t, \quad [28]$$

where $a_n$ is the amplitude of the nth Fourier harmonic, n is the harmonic number and ω is the angular frequency of the fundamental mode. The values of n in this instance will be odd integers i.e. n=1,3,5 ... In order to properly effect active acoustic control, $I_2(t)$ should have the form $$I_2(t) = I_o \Sigma a_n \sin(n\omega + \theta_n), \quad [29]$$

where $\theta_n$ is the phase delay for the nth mode. It will be seen that $\theta_n$ can also be chosen to maintain the rise and fall times of the pulse thereby maintaining its shape.

For a dispersive medium the leading and trailing edges of the second waveform will be delayed in time and accordingly shaped to fit the wave propagation properties characteristic of the mechanical coupling material by matching the waveform to that arriving on the far side of the material block through which the acoustic wave is travelling.

Discussion

An important consideration in the extension of active acoustic control in gradient coil design is acoustic shielding efficacy. The greater the acoustic attenuation achieved the less likelihood the whole concept will be vitiated when coil current is increased to make up gradient amplitude shortfall due to the active acoustic control.

In earlier attempts to design quiet coils, it was concluded that gradient coil wires should be supported by materials in which the compressional wave velocity, v, was high. It was also considered desirable that the wave attenuation per unit length, α, be ideally zero.

In the present invention both of these constraints are effectively removed by splitting each closed loop into two loops which are separated by either by a small air gap or a small gap coupled by a material in general different and softer than that of the plates themselves. In one embodiment the inner wires carrying current $I_2$ form a re-entrant narrow loop within the larger loop carrying current $I_1$. The proximity of the inner loop wires means that their magnetic field contribution outside the outer loop is effectively zero. In the new arrangement, both the amplitude and phase of $I_1$ and $I_2$ are variable to provide the optimum noise reduction.

In addition to gradient coil designs based on closed arc loops, re-entrant loops, rectangular loops and rectangular re-entrant loops, etc., the new principle of active acoustic control can be applied to concentric cylindrical transverse gradient designs of the fingerprint variety as well as to distributed z-gradients.

In all the above new coil arrangements it would mean that within the commonly used frequency range (1.0–3.0 kHz)

for Echo Planar (EPI) and Echo Volumar (EVI) imaging (P. R. Harvey & P Mansfield, Echo Volumar Imaging [EVI] at 0.5T: First Whole Body Volunteer Studies. Magn. Res. Med. 35, 80–88 (1996)), additional acoustic attenuation of between 10–25 dB is readily obtainable making a total attenuation of between 30–50 dB achievable.

Further Embodiments

Effect of Drive Wires

The above analysis assumes that the current drive circuit adds no acoustic noise. If this were the case measured values of A would be infinite. As we shall see from the experimental section, this is not the case. The achievable attenuation is limited by extraneous sound generated by the current supply leads to the coil.

Let the amplitude of the extraneous sound $A_{es}$ be $$A_{es} = e^{i\omega t} A_e. \qquad [30]$$

This should be added to Eq. [11]. The result of this is that Eq. [11] now becomes $$A = I_{So} - I_s \qquad [31]$$

$$= -20\log_{10}\left([2A_1/A_1']e^{-\alpha x}\sin\left[\left(2\pi\frac{fx}{v} - \theta\right)/2\right] + A_e/A_1'\right).$$

When the sine term vanishes the attenuation becomes $$A = -20\log_{10}(A_e/A_1). \qquad [32]$$

Thus Eq. [32] shows that the drive bus arrangement and not the coil determines the largest attenuation achievable. Careful construction and geometrical placing of the drive bus can reduce $A_e$ so that the residual attenuation is of the order of 50–60 dB.

Slotted boards

Figure 12A:
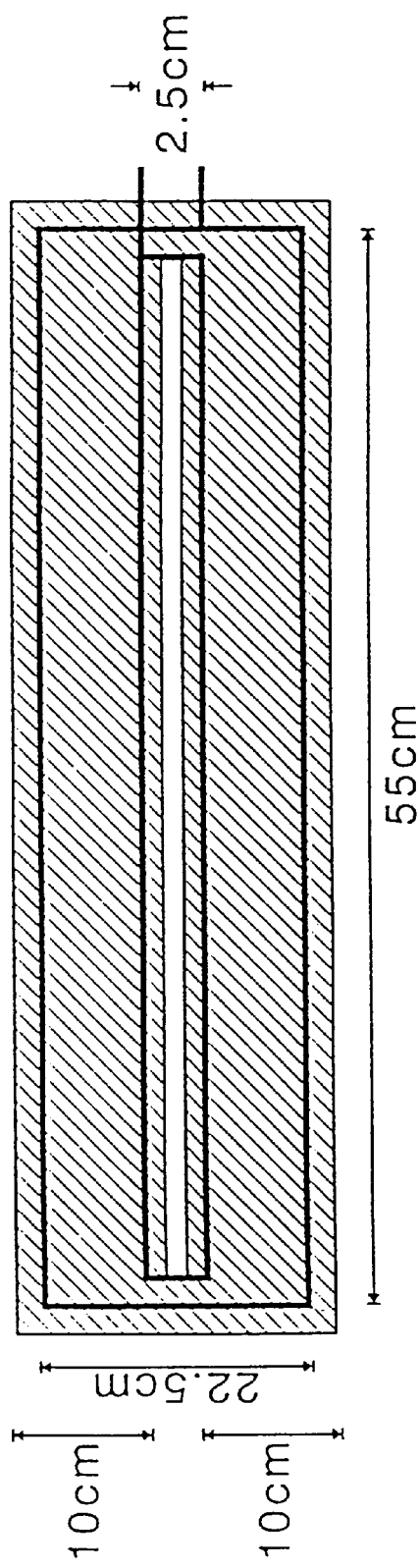
Figure 12B:
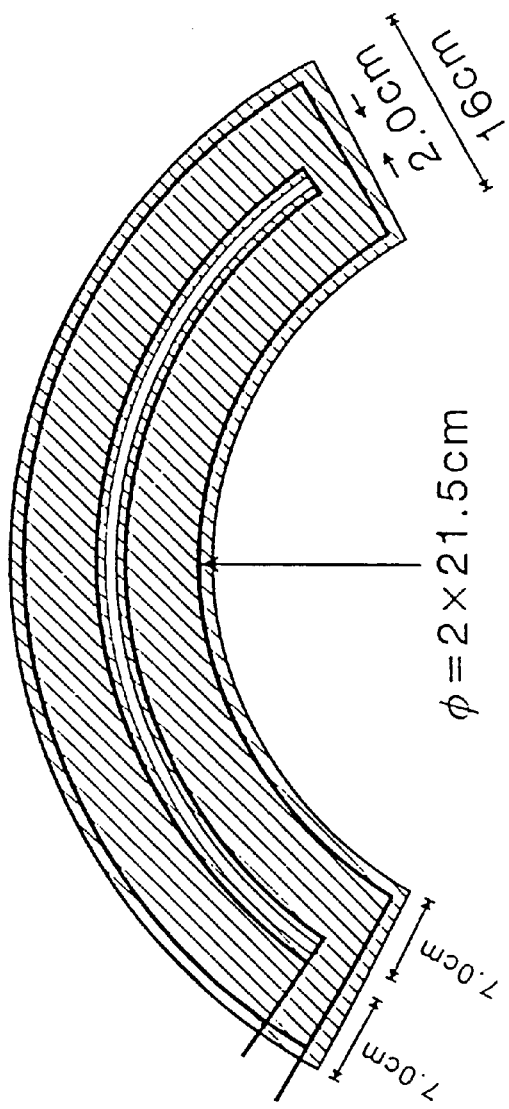

So far we have considered the possibility of filling the machined slots with a material which is in general different to the board material. We now consider the alternative possibility of simply leaving an air gap. This has advantages in that both halves of the board arrangement can move independently and in particular each half can take up a vibrational mode which is anti-phase to the other half. Inserting a hard material in the slot would inhibit this mode. Provided each half of the board maintains its positional integrity an air gap can be left. FIGS. 12a and 12b show two such arrangements, one for a rectangular re-entrant coil arrangement, the other for a re-entrant closed arc loop arrangement.

Total coil assembly

Figure 13C:
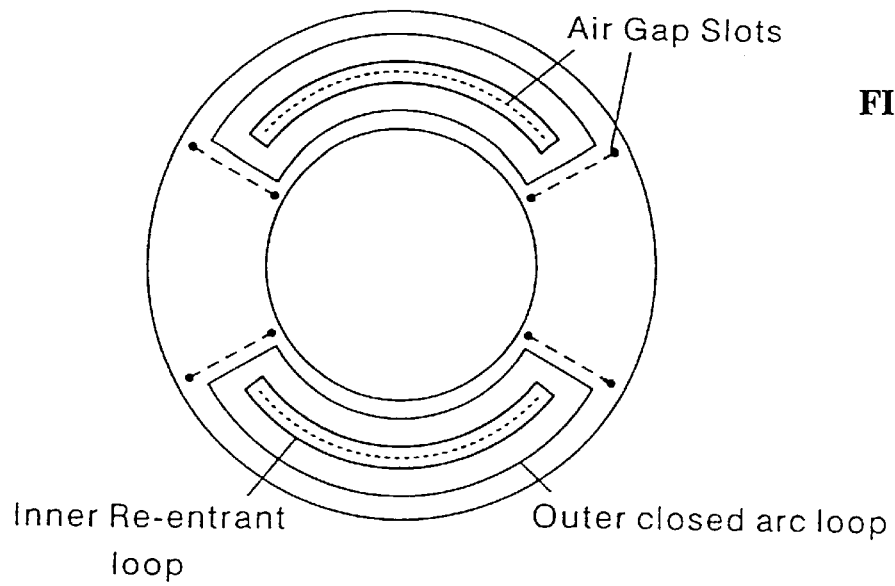

We have considered at length variations of the arc loops which would comprise a coil assembly. But we have not so far discussed the stacking arrangement for such an assembly. It is assumed throughout this work that acoustic noise is emitted from the flat faces of the boards supporting the arc loops or the rectangular loops, these being placed in a plane normal to the magnetic field. Of course in an ideal arrangement of plates no sound would be emitted along the field axis. However, there may well be residual sound levels emitted and in order to absorb these the coil support plates are spaced by rubber or suitable plastic absorbent material which is sandwiched between the plates as shown in FIG. 13 (a) and (c) with the requisite variable spacing to produce the optimum magnetic field gradient. As well as absorbing any residual sound emitted from the plate surfaces, provided the plate stack is bolted together, such an arrangement will reduce considerably the possibility of buckling modes or Chladni resonances occurring.

Plate spacers and coil cooling

Figure 13A:
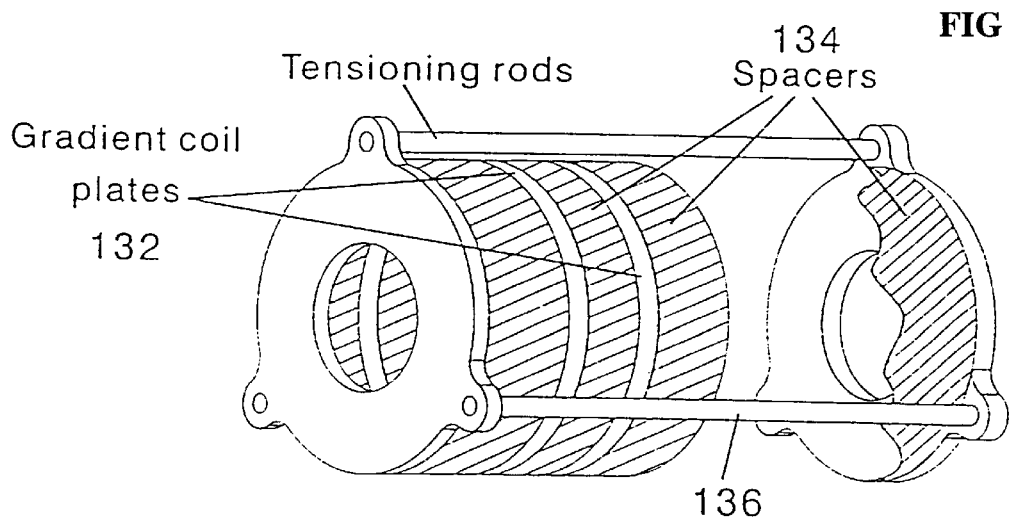
Figure 13B:
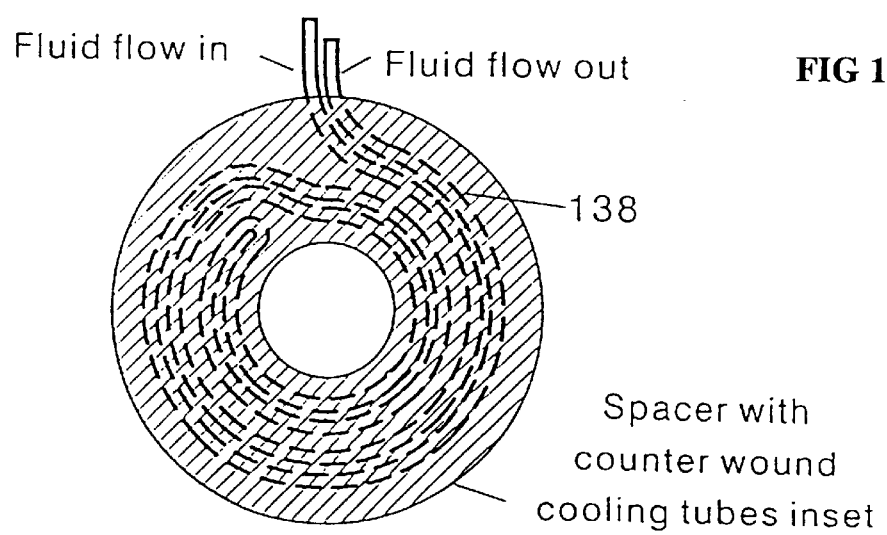

Spacer plates 134 will be required to maintain a rigid structure. These could be moulded rubber or plastic chosen for good acoustic absorption. The spacer plates would, in general, include flat pancake type cooling tubes 138 to dissipate heat from the adjacent coils. The whole arrangement would be pulled together by long non-metallic bolts. An arrangement is shown in FIGS. 13a and 13b.

Sound propagation in a flat annulus or in an arc section of an annulus

In all the analysis given previously we have assumed implicity that wave propagation in an annulus can be approximated by the plane wave expressions derived for the rectangular plates.

The wave equation in Cartesian coordinates for sound propagation in a solid of bulk modulus $M_B$ and density $\rho$ is given by $$\nabla^2 A(x, y, z, t) = \frac{1}{v^2}\frac{\partial^2 A(x, y, z, t)}{\partial t^2} \qquad [33]$$

where $A(x,y,z,t)$ is the amplitude of the sound wave passing through the material and where the velocity of the wave v is equal to $\sqrt{(M_B/\rho)}$. NB For a thin flat sheet of material we can replace $M_B$ by Young's modulus E. The solution of the wave equation can best be achieved by using the method of separation variables, in which case the general solution is given by $$A(x,y,z,t) = A_o e^{i k \cdot r} e^{i\omega t} \qquad [34]$$

where $$k^2 = \left(\frac{p\pi}{L_x}\right)^2 + \left(\frac{q\pi}{L_y}\right)^2 + \left(\frac{s\pi}{L_z}\right)^2 \qquad [35]$$

describes the allowable vibrational modes of the material block, subject to the boundary conditions of zero amplitude at the block faces and in which p,q,s are integers and $L_X, L_Y$ and $L_Z$ are the dimensions of the block of material, $$k = ik_x = jk_y + kk_z \qquad [36]$$

and $$r = ix + jy + kz. \qquad [37]$$

For one-dimensional propagation Eq. [34] reduces to the results already quoted previously. For a three-dimensional slab of material in which the wave amplitude along the z-axis is constant, we have $$A(x,y,t) = A_o e^{ik_x x} e^{ik_y y} e^{i\omega t}. \qquad [38]$$

Because of the orthogonality of the wave solutions, propagation along the x-axis and the y-axis are independent with wave solutions similar to those used previously. There we have assumed that the wave amplitude along the y-axis is constant. This situation obtains if the dimension of the slab of material along the y-axis is much greater than the x-dimension.

By choosing the slab of material to be rectangular, one can effectively suppress propagation along the long axis thereby concentrating on propagation along the short axis or x-direction. This is what we have implicitly assumed in interpreting the experimental results for a rectangular sheet.

We now turn to the general solutions of the wave equation in cylindrical polar coordinates. We choose cylindrical polar coordinates because the general shape of many common gradient coil structures have cylindrical symmetry along the magnetic field axis for typical superconductive magnets currently used for medical imaging.

In cylindrical polar coordinates the wave equation is $$\nabla^2 A(r,\psi,z,t) = \frac{1}{v^2} \frac{\partial A(r,\psi,z,t)}{\partial t^2} \qquad [39]$$

Apart from the coordinate changes, the symbols A and v have the same meaning as above. In this equation r is the radius measured in a direction orthogonal to the cylindrical axis, $\psi$ is the azimuthal angle and z is the position coordinate along the cylindrical axis. Equation [39] can also be solved by the method of separation of variables. We choose the three orthogonal solutions to Eq. [39] as $Z(r)$, $\Theta(\psi)$, $F(z)$. The general solution of Eq. [39] is therefore $$A(r,\psi,z,t) = Z_l(r)\Theta(\psi)F(z)e^{i\omega t}. \qquad [40]$$

By substituting into Eq. [39] and dividing by $A(r,\psi,z,t)$ we obtain $$\frac{Z''}{Z} + \left(\frac{1}{r}\right)\frac{Z'}{Z} + \left(\frac{1}{r^2}\right)\left[\frac{\Theta''}{\Theta} + \frac{F''}{F}\right] = \frac{-\omega^2}{v_2}. \qquad [41]$$

Since the functions are independent of each other we can solve each part of this equation separately. When this is done Eq. [41] becomes $$r^2 \frac{Z''}{Z} + r\frac{Z'}{Z} - [(m^2 - k^2)r^2 + l^2] = 0 \qquad [42]$$

where we have put $$F''/F = -m^2 \qquad [43]$$

and $$\Theta''/\Theta = -l^2 \qquad [44]$$

with $K = \sqrt{(k^2 - m^2)}$. In this case $Z_l(Kr)$ comprises the class of cylindrical functions, $\Theta(\psi) = e^{\pm il\psi}$ and $F(z) = e^{\pm imz}$, so that the complete solution is given by $$A(r,\psi,z,t) = A_o Z_l(Kr) e^{\pm il\psi} e^{\pm imz} e^{i\omega t}. \qquad [45]$$

The constants l, m are integers, that is to say, $l=0,\pm 1, \pm 2, \ldots$ and $m=0,\pm 1,\pm 2, \ldots$. We shall see below we are concerned only with values of $l=0,\pm 1$. The value $m=0$ corresponds to a radial acoustic wave which has constant amplitude along the z-axis. In the present invention we consider propagation of radial waves in a thin slice of the material so that we can take $m=0$ for most of what follows.

Since most actual gradient coil designs correspond to wires formed on an annulus of suitable material or on a segment of an annulus, we shall be concerned with three values only of l, namely for a complete annulus $l=0$ and for a segment of an annulus $l=\pm 1$.

The angular solution for $l=0$ corresponds to a radial wave with no polar angle variation. This situation obtains when considering z-gradient coils or Maxwell coils. The general solution of the radial part, Eq. [42], $Z_l(kr)$, includes the Bessel functions of the first kind $B_l(kr)$, the Bessel functions of the second kind $Y_l(kr)$, also known as the Neumann functions, $N_l(kr)$ and Bessel functions of the third kind $H_l^{(n)}(kr)$, or the Hankel functions of the first and second kind where n=1,2 respectively. For kr large the Hankel functions have the convenient property that they turn into weighted exponential functions, namely $$H_l^{(1)}(kr) \approx \sqrt{2/(\pi kr)}\, e^{i(kr - \frac{1}{2}l\pi - \frac{1}{4}\pi)} \qquad [46]$$

and $$H_l^{(2)}(kr) \approx \sqrt{2/(\pi kr)}\, e^{i(kr - \frac{1}{2}l\pi - \frac{1}{4}\pi)}. \qquad [47]$$

It is noted that the difference between $l=0$ and $l=\pm 1$ in the Hankel solutions is simply a phase shift. It is also noted that the wave amplitudes reduce as $1/\sqrt{(\pi kr/2)}$. In other respects the solutions are similar to the plane wave solutions in a rectangular sheet of material. We also note that the condition for the approximate Hankel solutions to apply is that kr is large so that we can deal with either large structures at relatively low frequencies or small structures at high frequencies. For situations which do not satisfy these conditions, it is necessary to revert to the Bessel functions of the first and/or second kind, or the exact Hankel functions. These are given by the identity $$H_l^{+,-}(kr) = J_l(kr) \pm iY_l(kr), \qquad [48]$$

where + and − refer to Hankel functions of the first and second kind respectively. Equation [48] can be written as $$H_l^{\pm}(kr) = R_l(kr) e^{\pm i\theta_l(kr)} \qquad [49]$$

in which $\theta_l \neq kr$ but can be calculated from $$\tan \theta_l(kr) = Y_l(kr)/J_l(kr) \qquad [49a]$$

and where $$R_l^2(kr) = J_l^2(kr) + Y_l^2(kr). \qquad [49b]$$

For small values of kr, therefore, the phase variation with frequency would not necessarily be linear but modified according to Eq. [49a].

In a manner similar to that used previously, we may write the amplitude term in Eq. [49] as $$R_l(kr) = e^{-\gamma_l(kr)} \qquad [49c]$$

where $\gamma_l(kr)$ is simply equal to $-\ln R_l(kr)$. We note that the exact Hankel functions diverge at the origin through the divergence of the Neumann functions. However, since we are dealing with an annulus or annular segment, solutions will not include the origin. Thus we are free to use the Hankel functions or their approximate forms, Eqs. [46,47]. In this work, however, the dimensions and frequencies used allow the above mentioned approximate Hankel solutions.

Modification of plane wave cancellation to include cylindrical solutions

Figure 14A:
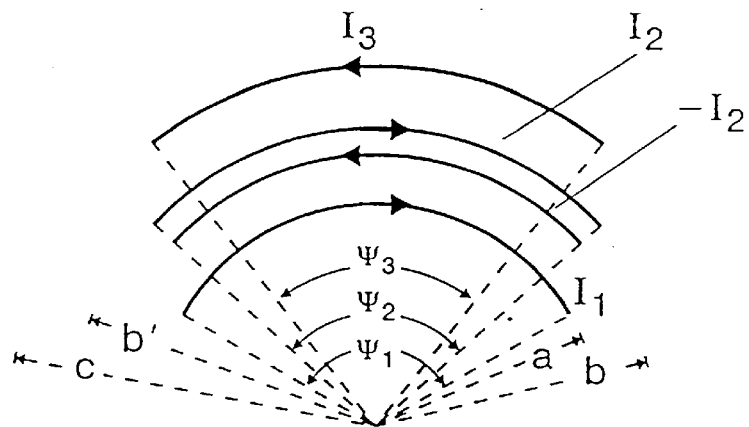

Using the above theory we are now in a position to modify our previous results for rectangular boards to give approximate solutions when the wires are in the form of an arc or a circle. Using the approximate Hankel solutions we may now rewrite Eq. [23] as $$A_s = -e^{i\omega t}e^{-i\pi(2l+1)/4}\sqrt{\frac{2}{\pi}}\left\{\frac{I_1\psi_1 a}{\sqrt{kb}}\left(e^{ikx}e^{-\alpha x} + \sqrt{\pi kb/2}\frac{b\psi_2 I_2}{a\psi_1 I_1}e^{i(\phi+\pi(2l+1)/4)}\right) - \frac{I_3\psi_3 c}{\sqrt{kb}}\left(e^{ikx}e^{-\alpha x} + \sqrt{\pi kb/2}\frac{b\psi_2 I_2}{c\psi_3 I_3}e^{i(\phi+\pi(2l+1)/4)}\right)\right\}$$ [50]

where we note that for arc segments l=1. In this expression we have included the arc angles $\psi_1$, $\psi_2$ and $\psi_3$. There are two cases to consider. The first is that all angles are equal. The wire arrangement is shown in FIG. 14*a*. In this case both halves of Eq. [50] may be made to vanish simultaneously when the phase terms are equalised, ie when kx=θ and for $$\phi = \frac{\pi}{4} + \theta \pm n\pi$$ [51]

with n=0,1 and when the amplitudes are given by $$\sqrt{\pi kb/2}\frac{bI_2}{aI_1} = e^{-\alpha x}$$ [52]

and $$\sqrt{\pi kb/2}\frac{bI_2}{c_3 I_3} = e^{-\alpha x}.$$ [53]

In order to satisfy these two conditions simultaneously we require that $$I_1 a = -I_3 c.$$ [54]

In this case the ratio of currents may be adjusted so that $$\frac{I_2}{I_1}\frac{b\sqrt{\pi kb/2}}{a} = e^{-\beta} = e^{-\alpha x}$$ [55]

so that finally $$\ln(I_2/I_1) = -\left(\beta + \ln\frac{b}{a} + \ln\sqrt{\pi kb/2}\right).$$ [56]

We note that three currents are required for this solution, $I_1$, $I_2$ and $I_3=(a/c)I_1$.

Figure 14B:
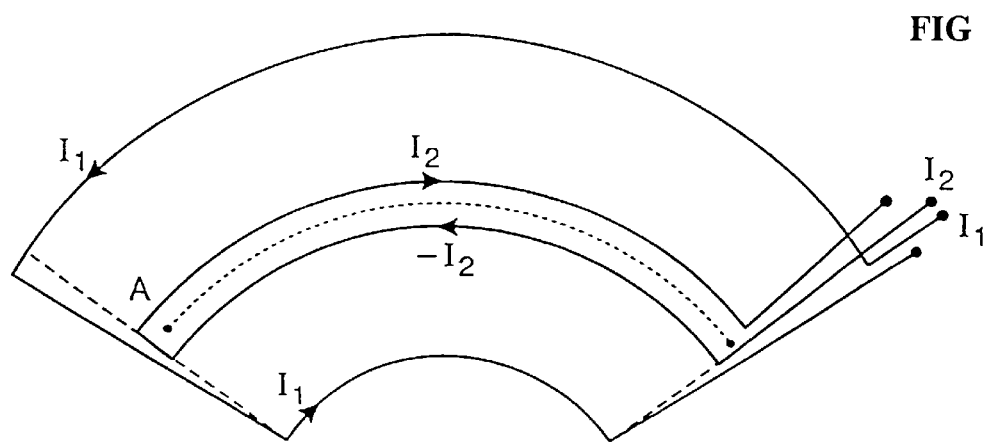

The second case is for a closed arc loop as shown in FIG. 14*b*. In order to maintain the integrity of this arrangement, slot AB (dotted) must leave some material at each end. This will complicate the wave propagation pattern and quench the radial vibrational modes at each end of the slot. We therefore ignore the wedge ends assuming that any vibrational modes of these will be at considerably different frequencies. In this case the arc angles $\psi_1$, $\psi_2$ and $\psi_3$ are all different. Both halves of Eq. [50] will have simultaneously zero solutions when the phase terms are equalised and when $$\sqrt{\pi kb/2}\frac{b\psi_2 I_2}{a\psi_1 I_1} = e^{-\alpha x}$$ [57]

and

-continued $$\sqrt{\pi kb/2}\frac{b\psi_2 I_2}{c\psi_3 I_3} = e^{-\alpha x}.$$ [58]

If we take $a\psi_1 = b\psi_2 = c\psi_3$ and set $I_1 = -I_3 = I$, both Eqs. [57 and 58] can be satisfied giving $$\sqrt{\pi kb/2}\frac{I_2}{I} = e^{-\alpha x}.$$ [59]

If we now let $$\sqrt{\pi kb/2}\frac{I_2}{I} = e^{-\beta}$$ [60]

we obtain finally that $$\ln(I_2/I) = -\left(\beta + \ln\sqrt{\pi kb/2}\right).$$ [61]

As a general comment concerning the position of the slot AB; in FIG. 14*b* it has to lie along an anti-nodal line when resonated in the fundamental mode before the slot is cut.

We now turn to the design of z-coils. Cylindrical z-coils comprise a distribution along the z-axis of conducting hoops, the planes of which are normal to the z-axis. We shall, therefore, consider acoustic screening of a single hoop. There are in fact three cases to be considered. Type 1 is shown in FIG. 15 where we have two concentric hoops 151,152 carrying currents $I_1$ and $I_2$. Because the angles subtended by both arcs are equal, ie $\psi_a = \psi_b = 2\pi$ we have from effectively one half of Eq. [50] with l=0, $$A_s = -e^{i\omega t}\frac{aI_1}{\sqrt{\pi kb/2}}\left(e^{ikx}e^{-\alpha x} - \sqrt{\pi kb/2}\frac{bI_2}{aI_1}e^{i\phi}\right).$$ [62]

For kx=θ, and when $$\phi = \pi - \theta \pm n\pi$$ [63]

with n=0,1, Eq. [62] may be made to vanish when $$\sqrt{\pi kb/2}\frac{bI_2}{aI_1} = e^{-\alpha x} = e^{-\beta}$$ [64]

which gives $$\ln\frac{I_2}{I_1} = -\left(\beta + \ln\frac{b}{a} + \ln\sqrt{\pi kb/2}\right).$$ [65]

The problem with the type 1 arrangement is that the field at the centre of each screened hoop includes contributions from $I_2$ which do not have the same phase angle as $I_1$. This may be considered an undesirable feature but can be overcome using the type 2 arrangement as shown in FIG. 16.

Here we have a slotted arrangement with 3 currents $I_1, I_2$ and $I_3$. If the slots 153,154,155 are not continuous around the hoop then $\psi_1 \neq \psi_2 \neq \psi_3$ for each segment. In this case we may set $I_3 = -I_1$ provided that $\psi_n$ are chosen such that for the three segments $2\pi a = 3\psi_2 b = 3\psi_3 c$. In this case the condition for the acoustic sound output to vanish is similar to that for the closed arc loops.

In the type 3 arrangement we consider the case that all arc angles are equal. In this case there is no support for the inner coil in FIG. 16. For this situation the condition that both halves of Eq. [50] vanish requires 3 currents, $I_1$, $I_2$ and $I_3$ together with $aI_1 = -cI_3$ giving the same condition as above, Eq. [65]. In a practical arrangement we do of course require supports. In the case that some material is left as support segments at 3 or 4 places around the slot, Eq. [65] will to some extent be violated.

Acoustically controlled and magnetically screened gradient coils

So far we have been mainly concerned with the design of gradient coils which are acoustically controlled but which do not have inherent active magnetic screening present. In the Section on Magnetic Screening with Active Acoustic Control we mentioned briefly the possibility of adding active magnetic screening to extant gradient coils designed primarily to reduce acoustic noise. The difficulty with this approach is that addition of a magnetic screen around such a coil assembly would itself require an acoustic force shield so that potential noise generated by it could also be attenuated. In addition, more space or a greater radial build would be required to accommodate the additional features of the gradient coil system. In this Section, therefore, we return to the question of combining from the outset active magnetic screening with active acoustic control.

Figure 17A:
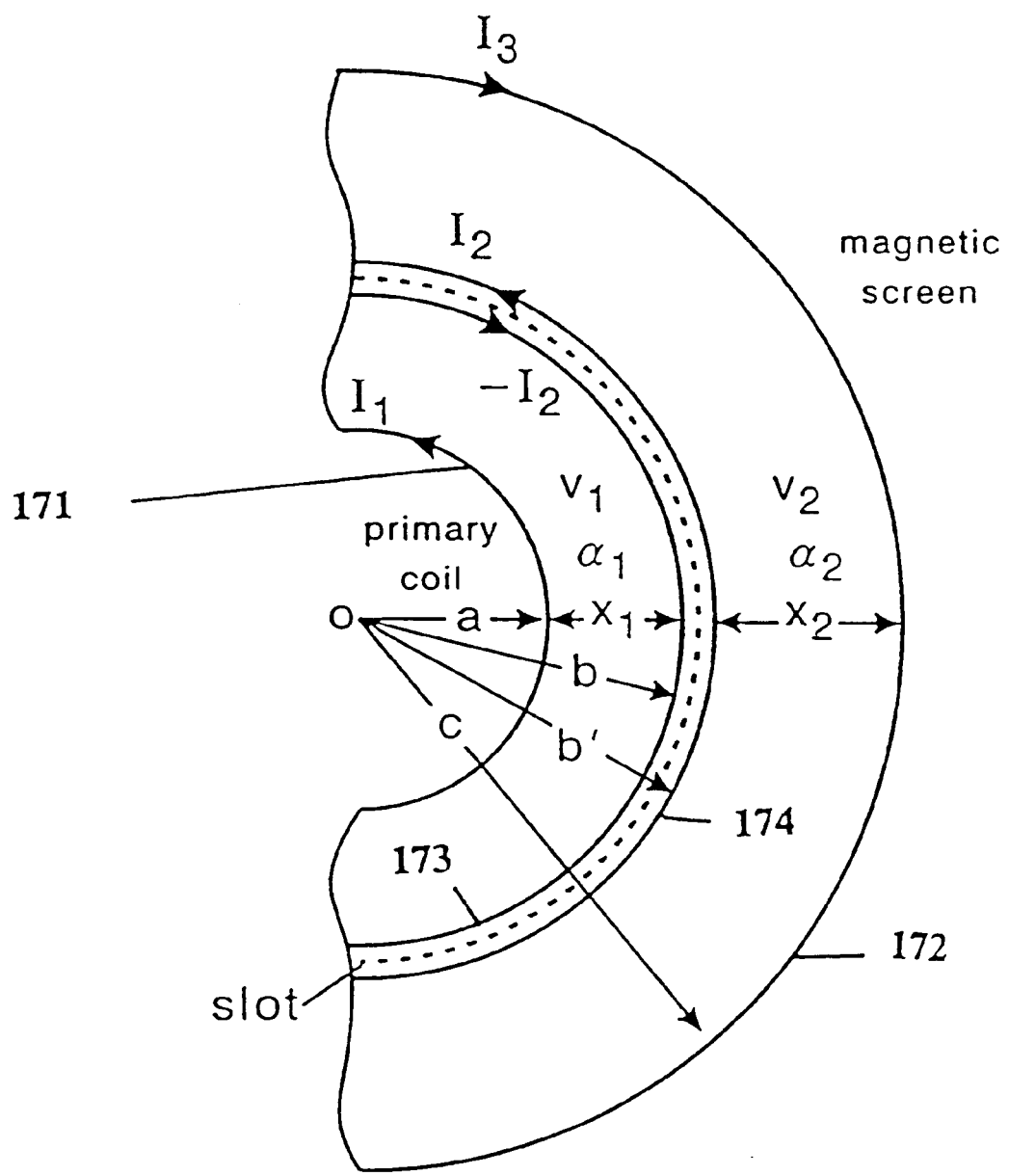

For our purposes we now consider the design of standard magnetically screened fingerprint type cylindrical gradient coil systems. We pose the question; can we include in the basic gradient coil design a means to reduce the acoustic noise without impairing or in any way compromising the magnetic screening properties of the coil? The standard design of magnetically screened coils requires essentially two cylindrical coils; a primary 171 on a cylinder of radius a and a magnetic screen 172 wound on a cylinder of radius c coaxial with the primary coil. This arrangement is sketched in FIG. 17a. In this figure we also interpose an acoustic shield 173,174 arrangement with wires at radii b,b' which lies somewhere between a and c, a distance $x_1$ from the primary. The distance between the primary coil and magnetic screen is x. In this new arrangement we shall assume that the space between the primary and magnetic screen is filled with two different materials forming two separate cylindrical annuli of thicknesses $x_1$ and $x_2$ with acoustic propagation velocities $v_1$ and $v_2$ and attenuations $\alpha_1$ and $\alpha_2$ respectively. We are now in a position to apply the cylindrical wave theory developed hereinbefore.

To find the optimum position for an acoustic screen we require that the phase and amplitude of the wave emitted from the surface of radius a and arriving at the surface of radius b is equal and opposite to the cylindrical wave emitted at the surface of radius c arriving at the surface of radius b'. From our previous analysis we can straightforwardly write down the condition when b≈b' as $$\frac{I_1 a}{\sqrt{\pi K_1 b/2}} e^{ik_1 x_1} e^{-\alpha_1 x_1} = \frac{-I_3 c}{\sqrt{\pi k_2 b/2}} e^{ik_2 x_2} e^{-\alpha_2 x_2} \quad [66]$$

where $I_1$ and $I_3$ are the currents in the primary coil and magnetic screening coil. Strictly speaking we should be looking at the force acting on the primary and magnetic screen surfaces. As an example we consider a z-gradient coil comprising a set of cylindrical hoops the relationship between these two currents is given by $$n_c I_3 = -n_a I_1 \left(\frac{a}{c}\right)^2 \quad [67]$$

where $n_a$ and $n_c$ are the numbers of turns on the primary coil and magnetic screen respectively. For $n_a = n_b$, Eq. [67] can be substituted in Eq. [66] to give $$e^{ik_1 x_1} e^{-\alpha_1 x_1} = \sqrt{\frac{k_1}{k_2}} \left(\frac{a}{c}\right) e^{ik_2 x_2} e^{-\alpha_2 x_2}. \quad [68]$$

The conditions for equalisation of Eq. [68] are: for phase;

$$k_1 x_1 = k_2 x_2 \quad [69]$$

for geometrical constraint;

$$x_1 + x_2 = c - a = \Delta \quad [70]$$

and finally for modulus of amplitude $$-\alpha_1 x_1 = -\alpha_2 x_2 + \ln\left(\frac{a}{c}\right) + 1/2 \ln\left(\frac{k_1}{k_2}\right). \quad [71]$$

In order to obtain an overall simultaneous solution of the above three equations, we solve Eq. [69] and Eq. [70] simultaneously knowing $k_1$ and $k_2$. This fixes $x_1$ and $x_2$. These values are then substituted into Eq. [71] together with known values of $\alpha_1$ and $\alpha_2$ which allow Eq. [71] to be solved producing a value of the primary radius a necessary to support the simultaneous solution of Eq. [68]. An alternative approach is to choose the ratio a/c and solve Eq. [71] approximately by ignoring the attenuation terms to give $k_1/k_2$. Using this ratio $x_1$ and $x_2$ can be found allowing an iteration of $k_1/k_2$ and $x_1$ and $x_2$.

Figure 17B:
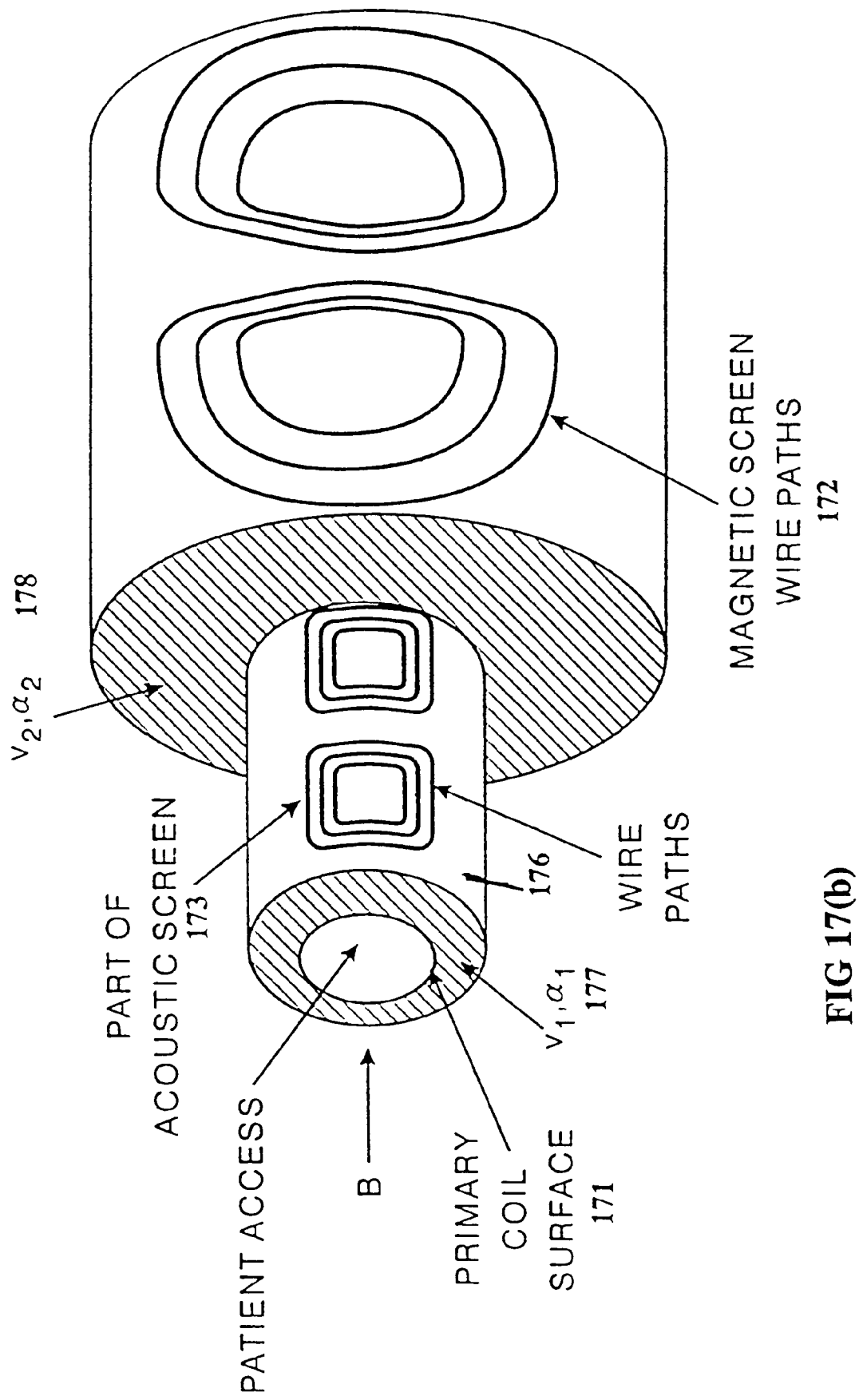

Of course it may be that the velocities and attenuations available in certain materials will not permit a solution with a required value of a. With common materials there is, in fact, a considerable choice of propagation velocity to choose from. In general our experience is that for materials with high propagation velocity the attenuation per unit length is often smaller than in materials with a lower propagation velocity. For fine adjustment in the solution of the equations and especially if a specific value of primary radius a is required, the two annuli of thickness $x_1$ and $x_2$ may themselves comprise a composite structure made of concentric cylinders, the material and thickness being chosen to produce the required average velocity and required attenuation. Alternatively filler materials may be added to the plastics in order to change their intrinsic wave velocities to those required. For example, addition of glass beads or fibres will increase the velocity as will addition of alumina crystals. FIG. 17b is a sketch of a transverse fingerprint type magnetically screened gradient coil 171 (not shown) mounted on the inner surface with screen 172. Also shown is one 176 surface forming part of the acoustic shield. The coils on each of the two cylinders 177,178 are potted in two different materials.

What is important is the simple fact that such a solution to the acoustic problem is in principle possible and that with such a solution no additional price is paid in terms of loss of magnetic screening or loss or change of magnetic field strength at the centre of the coil system. The latter is because the acoustic screen comprises two coil structures and a current distribution which produces zero magnetic field at the centre of the coil system. Between the two coil structures would be a very thin air space or soft support for the inner and outer cylinders.

The wire pattern for the two coils comprising the acoustic screen are essentially the same if b≈b'. The pattern detail per quadrant for transverse fingerprint coils is largely arbitrary and could be a radially registered version of either the inner or primary magnetic coil of radius a or the outer magnetic screen coil at radius c. If b≠b' we can even look for suitable solutions when the half acoustic screen at radius b is radially registered with the primary coil and the second half of the acoustic screen at radius b' is radially registered with the outer magnetic screen. Whichever route is chosen, the azimuthal symmetry must follow the gradient coil symmetry in order to prevent excitation of cylindrical flexing modes distorting the supporting annuli from circular to elliptic form. We also assume no wave propagation along the z-axis since we have set m=0. See later subsection Acoustic Control with Magnetic Screening.

Experimental results

In this section we present experimental results for a rectangular coil with re-entrant loop and a closed arc loop segment with re-entrant loop. A sketch showing the experimental arrangement and dimensions for both loop arrangements is shown in FIG. 12. Using the experimental arrangement shown earlier in FIG. 5 we have measured the acoustic response of a rectangular coil. Typical results are plotted in FIG. 18. The squares show the acoustic response when the inner and outer loops carry the same current in anti-phase. The circles show the acoustic response when the phase only is optimised to reduce acoustic output. When phase and amplitude of the inner loop or the outer loop is changed to minimise the acoustic output, the results shown as triangles are obtained. The superscripts 1 and 2 mean that current 1 is held constant and current 2 varied to obtain a minimum or current 2 is held constant and current 1 is varied to obtain a minimum acoustic output. In both cases an iterative procedure is used to provide the best combination of phase $\phi$ and current ratio. The continuous line is the theoretical expression, Eq. [31] for $\theta=\alpha=0$. It is noted that in the optimum situation noise output attenuation of 40–50 dB is straightforwardly obtained.

The residual noise output level is thought to arise from the current drive circuit and the coupling from the drive to the coil support board. The general behaviour of the rectangular loop is well described by Eqs. [14 and 31]. FIG. 19 shows a graph of phase angle $\phi$ versus frequency f for the data shown in FIG. 18. It is clear that phase does not necessarily follow a single curve but can hop from one curve to another as predicted. From the dimensions of the board, the data of FIG. 18 and Eq. [3], we deduce that $\tau=111.11$ $\mu$s giving a propagation velocity v=0.9 kms$^{-1}$. The board material was unfilled solid polystyrene and the board thickness was 12 mm. Both the inner and outer wire loops comprise three turns of 16 s.w.g (1.6 mm) copper wire. The receiving microphone was approximately 1 m from the board which was placed within a magnet such that its plane was orthogonal to the magnet axis and therefore field direction. The best results obtained were for an unfilled central slot forming an air gap, although other arrangements were tried in which the slot was filled with either glass filled epoxy or rubber.

Similar experiments were performed on closed arc loop segments mounted on solid polystyrene (a) and Perspex (b) with re-entrant coils. In these arrangements the central slots were left unfilled. FIG. 20 shows the measured acoustic responses and FIG. 21 the corresponding phase variations. From the dimensions of the arc segments, the data of FIG. 20 and Eq. [3], we deduce that for both materials and within experimental error $\tau=83.33$ $\mu$s giving a common propagation velocity v=0.84 kms$^{-1}$.

Relatively little data were obtained on this arrangement but what there is confirms that deforming a rectangular structure into a closed arc loop segment does not vitiate the principle of acoustic control and confirms our theoretical results, Eqs. [50 and 61], that almost complete nullification of acoustic output in such arc segments is possible. The phase data also confirm the general behaviour predicted by Eq. [51]. As with the rectangular coil results, the coils in both the outer loop and the inner re-entrant loop were given three turns of 16 s.w.g. copper wire.

These results substantiate the theory developed so far but it is emphasised that they have been obtained on isolated flat coils which would form the basis of a building block to create a transverse gradient coil arrangement. It remains to be seen experimentally whether a full blown gradient set would have the same degree of acoustic output attenuation as is achieved in an isolated coil section.

Acoustic control with magnetic screening

We have considered above the case when an acoustic shield comprising cylindrical coils with radii b, b' is inserted into a standard magnetically screened gradient coil. In that treatment two factors have been ignored, namely (i) we have neglected the residual magnetic field gradient generated by the field at the coil centre and (ii) we have used an arbitrary wire pattern for each half of the acoustic screen. We now address these two points by considering the mathematical treatment for a fully screened, fully force shielded cylindrical gradient set in which both the primary coil and magnetic screen, with radii a, b respectively, are matched with additional cylindrical coils of radii f, F forming the acoustic shield. However, before describing this we briefly recapitulate on the Fourier space design method (R. Turner and R. Bowley. Passive screening of switched magnetic field gradients J. Phys. E. 19, 876–879 (1986). (R. Turner. A target field approach to optimal coil design J. Phys. D: Appl. Phys. 19, L147–L151 (1986) (P. Mansfield and B. Chapman. Multi-shield active magnetic screening of gradient coils in NMR. J. Mag. Res. 72, 211–223 (1987)) for cylindrical distributed wire coils.

Let the x-gradient primary coil of cylinder radius a be characterised by the surface current stream function $S_a(\psi, Z)$. Wirepaths are given by contours of $S_a$. The current distribution is described by $$J = -\nabla S_a \times n \quad [72]$$

where n is the unit vector normal to the cylinder surface at any point. J has the following components:

$$J_z = \frac{1}{a}\frac{\partial S}{\partial \psi} \quad [73]$$

and $$J_\psi = -\frac{\partial S}{\partial z}. \quad [74]$$

The mth component in the Fourier transform of Eq. [74] is $$J_\psi^m(k) = ik\, S_a^m(k) \quad [75]$$

where $$J_\psi^m(k) = FT\{J_\psi(\psi,z)\} = \frac{1}{2\pi}\int_{-\infty}^{\infty} dz \int_{-\pi}^{\pi} d\psi\, e^{-im\phi} e^{-ikz} J_\psi(\psi,z) \quad [76]$$

and $$S_a^m(k) = FT\{S_a(\psi,z)\}. \quad [77]$$

We emphasise that the symbol k used here and below now signifies reciprocal space in the magnetic design process. From now on the acoustic wave propagation constant is denoted by q.

For an x-gradient coil only $S_a^1$ and $S_a^{-1}$ are non-zero.

The internal field is given by $$B_z = \frac{-\mu_0}{\pi}\int_{-\infty}^{\infty} dk\, ik^2 a\, e^{ikz}\cos\psi\, S_a^1(k) K_1'(ka) I_1(kr). \quad [78]$$

The external field is given by $$B_z = \frac{-\mu_0}{\pi}\int_{-\infty}^{\infty} dk\, ik^2 a e^{ikz}\cos\psi\, S_a^1(k) I_1'(ka) k_1(kr) \quad [79]$$

where r is the radial polar co-ordinate.

Active Acoustic shields

We now add a second coil to form an acoustic shield which is also characterised by a surface current stream function $S_f(\psi,z)$ which is similar to that being shielded, which resides on a cylinder of radius f. For acoustic control we require that $$S_f^1(\psi,z) = \frac{-aA}{f} S_a^1(\psi,z). \quad [80]$$

This ensures that the wirepaths are radially registered, that is to say, they have the same values of z,ψ on each coil and the correct ratio of currents given by 1:aA/f.

Acoustic Shielding and Active Magnetic Screening

We now consider four coils wound on cylindrical surfaces, the primary and magnetic screen on radii a and b respectively, and the primary acoustic shield and the magnetic screen acoustic shield on radii f,F respectively. See FIG. 22 for general coil assembly layout. The relevant stream functions for this arrangement are tabulated below.

| radius | Stream Function | Function |
|---|---|---|
| a | $S_a$ | primary coil |
| f | $S_f$ | acoustic shield for primary |
| b | $S_b$ | active magnetic screen |
| F | $S_F$ | acoustic shield for magnetic screen |

For acoustic control we require that $$S_f^1 = \frac{-aA}{f} S_a^1 \quad [81]$$

and also that $$S_F^1 = \frac{-bB}{F} S_b^1 \quad [82]$$

thereby producing two radially registered pairs of coils. The constants A,B are dependant on the acoustic properties of the support media. Because of current phase shifts introduced into the acoustic shield, we cannot produce total field cancellation for r>b. We therefore restrict this condition to fields from the primary coil and magnetic screen only. For field cancellation at radii r>b we need $$a\, I_1'(ka) S_a^1(k) + b I_1'(kb) S_b^1(k) = 0. \quad [83]$$

The internal field of the acoustic shield only at radii r<a is controlled by the kernel $$T_i = fK_1'(kf) S_f^1(k) + FK_1'(kF) S_F^1(k). \quad [84]$$

Rearranging Eq. [12] we get $$S_b^1(k) = -\frac{aI_1'(ka)}{bI_1'(kb)} S_a^1(k). \quad [85]$$

The internal field excluding the acoustic shield is given by $$B_z = \frac{-\mu_0}{\pi}\int_{-\infty}^{\infty} dk\, ik^2 e^{ikz}\cos\psi\, I_1(kr) T_i \quad [86]$$

where the internal kernel is $$T_i = \sum_l l S_l^1(k) K_1'(kl) \quad [87]$$

and where l=a,b. Using Eqs. [81] and [82] we obtain $$T_i = a\, S_a^1(k) K_1'(ka) + b\, S_b^1(k) K_1'(kb). \quad [88]$$

Using Eqs. [84] and [85] gives $$T_i = S_a^1(k) T_i' \quad [89]$$

where the sub-kernel $T_i'$ is $$T_i' = a\left\{[K_1'(ka) - K_1'(kb)] \times \frac{I_1'(ka)}{I_1'(kb)}\right\}. \quad [90]$$

The target field approach (10) may now be used in which we specify spatially a field $B_z(c,\psi,z)$ within a cylindrical region of radius c. Fourier transforming then gives $B_z^1(c,k)$ at radius c. Equating the integrand of Eq. [46] to $B_z^1(c,k)$ and inverting we obtain for $S_a^1(k)$ the expression $$S_a^1(k) = \frac{-\pi}{\mu_0 k^2 I_1(kc) T'} B_z^1(c,k). \quad [91]$$

From our earlier work the constants A and B above are $$A = \frac{a}{\sqrt{\pi q_1 f/2}} e^{iq_1 x_1} e^{-\alpha_1 x_1} \quad [92]$$

-continued and $$B = \frac{b}{\sqrt{\pi q_2 F/2}} e^{iq_2 x_2} e^{-\alpha_2 x_2} \quad [93]$$

where, introducing the angular frequency $\omega$, we denote the wave propagation constants, $q_1=\omega/v_1$ and $q_2=\omega/v_2$ for the two media to distinguish from k here used to note reciprocal space in the magnetic design procedure. From Eqs. [81,82] and [84] we obtain the internal sub-kernel for the acoustic shield $$T'_1 = -a\left(AK'_1(kf) - \frac{BK'_1(kF)I'_1(ka)}{I'_1(kb)}\right). \quad [94]$$

This equation must be minimised for particular values of a,b by initially ignoring wave attenuation and phase and by varying the independent variables $f, F, v_1$ and $v_2$. The phase and geometrical constraints, Eqs. [69 and 70] are taken into account later in an iteration process which includes the wave attenuation terms.

In summary, the procedure is therefore to specify $B_z(c, \psi, z)$, use Eq. [91] to calculate $S_a^1(k)$, then use Eq. [85] to calculate $S_b^1(k)$. The minimum internal field for the acoustic screen is determined by Eq. [94].

From Eqs. [81] and [82], currents in the acoustic shields are always less than those in the adjacent acoustically shielded coil. Because the acoustic screen is driven from its own generator source at the appropriate amplitude and phase angle, there is no problem with current balance. For magnetic screening, Eq. [85] specifies a current ratio between the primary and magnetic screen. As in normal non-acoustically shielded coils, Eq. [85] can be satisfied by varying the ratio of primary/screen turns. The same procedure will apply to the acoustic shield.

While we have ensured that the screen gives a minimal magnetic field contribution to the required gradient, it is emphasised that there will also be a small magnetic field generated by the screens outside the magnetic screen, ie for r>b. This is given by $$B_z = \frac{-\mu_0}{\pi} \int_{-\infty}^{\infty} dk\, ik^2 e^{ikz} \cos\psi K_1(kr) T_o \quad [95]$$

where $$T_o = S_a^1(k) T_o' \quad [96]$$

and where $T_0'$ is given by $$T'_o = -aAI'_1(kf) + \frac{aBI'_1(kF)I'_1(ka)}{I'_1(kb)}. \quad [97]$$

The external field is expected to be relatively small. We conclude, therefore, that acoustic control designs which employ radial registration of both halves of the acoustic shield with the corresponding adjacent primary coil and magnetic screen will always give unwanted magnetic field components at the gradient coil centre as well as vitiating the magnetic field screening efficacy.

It may be argued that it is more important to preserve the purity of the magnetic gradient by making the acoustic shield magnetic contribution zero at the coil centre. This may be done by setting $T_i=0$ in Eq. [94]. We can also force at least one of the shield coils to be radially registered with the gradient coil. Let coils at radii a and f be radially registered. Then Eq. [84] may be written as $$S_F^1(k) = \frac{aAK'_1(kf)}{FK'_1(kF)} S_a^1(k). \quad [98]$$

The external field from the acoustic shield is controlled by the kernel $T_o$ given by $$T_o = -aAI'_1(kf)S_a^1(k) + FI'_1(kF)S_F^1(k). \quad [99]$$

Substituting for $S_f(k)$ from Eq. [98] we obtain finally for the sub-kernel $T_o'$ $$T'_o = -aA\left\{I'_1(kf) - I'_1(kF)\frac{K'_1(kf)}{K'_1(kF)}\right\}. \quad [100]$$

We see from Eq. [100] that $T_o' \to 0$ as $f \to F$. Thus for two closely spaced acoustic shield coils as described above, the magnetic screening of the coil system would not be perfect but could well be acceptable. This approach also allows some flexibility in choosing f and F, thereby making acoustic matching easier to achieve.

I claim:

1. An active acoustically controlled magnetic coil system which is adapted to be placed in a static magnetic field, the coil comprising a plurality of first electrical conductors and a plurality of at least second electrical conductors, the first and at least the second conductors being mechanically coupled by means of at least one block of material with a predetermined acoustic transmission characteristic and in which the first and at least the second conductors are spaced at a predetermined distance apart, first electrical current supply means for supplying a first alternating current to said plurality of first electrical conductors, at least a second electrical current supply means for supplying at least a second alternating current to said plurality of at least second electrical conductors, said first and at least second currents characterized in that they have different and variable amplitudes and different and variable relative phases, both these features being determined by the acoustic characteristics of the material and by its geometry and the predetermined distance, the amplitudes and relative phases of said first and second currents in said first and second conducts being selected specifically to create a destructive interference so as to substantially attenuate acoustic noise output from the coil system.

2. An active acoustically controlled magnetic coil system as claimed in claim 1, in which the first and second electrical current supply means comprises means for supplying current waveforms with controllable shape said waveforms being shaped to fit the wave propagation properties characteristics of the mechanical coupling material.

3. An active acoustically controlled magnetic coil system as claimed in claim 2, including means for adjusting the amplitude of the second current to be a defined ratio of the amplitude of the first current, the defined ratio being a function of both the distance by which the first and second conductors are separated and the acoustic transmission characteristics of the coupling material.

4. An active acoustically controlled magnetic coil system as claimed in claim 1 in which the first electrical conductor forms an outer loop and the second electrical conductor forms an inner re-entrant loop.

5. An active acoustically controlled magnetic coil system as claimed in claim 4 in which the coil is a gradient coil and in which the planes in which the coils are positioned are at a distance z from a datum so as to optimize the gradient field.

6. An active acoustically controlled magnetic coil system as claimed in claim 4, in which the inner re-entrant loop comprises first and second substantially parallel path portions connected by a relatively short joining portion, the first and second portions being embedded in first and second separate material blocks, the blocks being mechanically coupled together.

7. An active acoustically controlled magnetic coil system as claimed in claim 6, in which the mechanical coupling comprises a suitable coupling material.

8. An active acoustically controlled magnetic coil system as claimed in claim 7, in which the coupling material is a solid polymer material which is different material to that used to support the first conductor or outer loop.

9. An active acoustically controlled magnetic coil system as claimed in claim 7, in which the mechanical coupling comprises an air gap with spacers positioned at intervals to separate the first and second blocks.

10. A method of designing an active acoustically controlled magnetic coil system comprising the steps of:
defining first and second substantially parallel conductor paths;
defining an acoustic transmission material having predetermined characteristics to encase the first and second parallel conductors at a predetermined distance apart;
determining a first alternating current at a first amplitude and phase to flow in the first parallel conductor path;
determining a second alternating current at a second variable amplitude and variable relative phase different to said first amplitude and phase to flow in the second parallel conductor path,
the amplitude and relative phase of the second current being determined by the acoustic characteristics of the material and by its geometry and the predetermined distance, the amplitudes and relative phases of said first and second currents in said first and second parallel conductors being selected specifically to create a destructive interference so as to substantially attenuate acoustic noise output from the coil system.

11. A method as claimed in claim 10 in which the substantially parallel paths are arcuate when the rectangular loops are deformed into closed arc loops.

12. An active acoustically controlled magnetic coil system including a coil structure comprising four substantially parallel conductors in a mechanically coupled system including first and second outer conductors and first and second inner conductors, each first and second outer conductor being mechanically coupled to a respective first and second inner conductor by first and second blocks of material with defined acoustic transmission characteristics and in which the first and second blocks are connected together by a third acoustically transmissive material and including first and second electrical current supply means for respectively supplying first and second currents to said first and second outer conductors and to said first and second inner conductors, said first current and said second currents being characterized in that they have different and variable amplitudes and different and variable relative phases, both these features being determined by the acoustic characteristics of the acoustic materials and by the geometries and predetermined distances, the amplitude and phases of said first and second currents in said first and second outer conductors and said first and second inner conductors being selected specifically to create a destructive interference so as to substantially attenuate acoustic noise output from the coil system.

13. An active acoustically controlled magnetic coil system as claimed in claim 12 in which the coil system further comprises magnetic screening coil means.

14. An active acoustically controlled magnetic coil system as claimed in claim 13 in which the magnetic screening coil means is acoustically screened with a coil structure comprising four substantially parallel conductors in a mechanically coupled system including first and second outer conductors and first and second inner conductors, each first and second outer conductor being mechanically coupled to a respective first and second inner conductor by first and second blocks of material with defined acoustic transmission characteristics and in which the first and second blocks are connected together by a third acoustically transmissive material and including first and second electrical current supply means for respectively supplying first and second currents to said first and second outer conductors and to said first and second inner conductors, said first current and said second currents being characterized in that they have different and variable amplitudes and different and variable relative phases, both these features being determined by the acoustic characteristics of the acoustic materials and by the geometries and predetermined distances, the amplitude and phases of said first and second currents in said first and second outer conductors and said first and second inner conductors being selected specifically to create a destructive interference so as to substantially attenuate acoustic noise output from the coil system.

15. An active acoustically controlled magnetic coil system as claimed in claim 12 in which the material of the first and second blocks is identical to the material of the third acoustically transmissive material.

16. An active acoustically controlled magnetic coil system as claimed in claim 15 in which the conductors are arranged in arcs.

17. An active acoustically controlled magnetic coil system as claimed in claim 16, in which the coils form a gradient coil system for an MRI apparatus.

18. An active acoustically controlled magnetic coil system as claimed in claim 12 in which the third acoustically transmissive material is air, the first and second blocks being mechanically held together only at defined areas.

19. An active acoustically controlled magnetic coil system as claimed in claim 12, in which the third acoustically transmissive material comprises a coupling block of acoustically transmissive material.

* * * * *